(12) United States Patent
Koiwa et al.

(10) Patent No.: US 7,436,647 B2
(45) Date of Patent: Oct. 14, 2008

(54) THIN-FILM CAPACITOR INCLUDING AN OPENING THEREIN

(75) Inventors: Ichiro Koiwa, Tokyo (JP); Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 252 days.

(21) Appl. No.: 11/181,781

(22) Filed: Jul. 15, 2005

(65) Prior Publication Data

US 2006/0046377 A1 Mar. 2, 2006

(30) Foreign Application Priority Data

Sep. 2, 2004 (JP) ............................. 2004/256218

(51) Int. Cl.
*H01G 4/005* (2006.01)
*H01G 4/06* (2006.01)
(52) U.S. Cl. ...................................... 361/303; 361/311
(58) Field of Classification Search ......... 361/303–305, 361/311; 257/301, 303, 306–307
See application file for complete search history.

(56) References Cited

U.S. PATENT DOCUMENTS 6,266,227 B1 * 7/2001 Konushi et al. .......... 361/306.1
6,356,429 B2 * 3/2002 Hayashi ..................... 361/303
7,161,793 B2 * 1/2007 Kurihara et al. .......... 361/306.3

FOREIGN PATENT DOCUMENTS

JP 10-189389 7/1998

* cited by examiner

*Primary Examiner*—Eric Thomas
(74) *Attorney, Agent, or Firm*—Volentine & Whitt, P.L.L.C.

(57) ABSTRACT

A thin-film capacitor includes a lower electrode film, a high dielectric film and an upper electrode film disposed sequentially. One film of the three films includes first and second edge portions placed opposite to each other. Furthermore, the one film includes a first opening which extends from the first edge portion toward the second edge portion and a second opening which extends from the second edge portion toward the first edge portion. Also, the first and second openings are respectively terminated away from the second and first edge portions. Alternatively, one film of the three films includes a plurality of edge portions which configure an outline of the one film. Furthermore, the one film includes a plurality of openings which respectively extend therethrough and which are terminated away from all the edge portions. Also, there is provided a manufacturing method of the thin-film capacitor.

22 Claims, 26 Drawing Sheets

THIN-FILM CAPACITOR INCLUDING AN OPENING THEREIN

BACKGROUND OF THE INVENTION

1. Field of the Invention

The present invention relates to a thin-film capacitor and a manufacturing method of the thin-film capacitor, in particular, to a thin-film capacitor which is disposed over a substrate in which an electronic circuit is formed and which has an improved high-frequency property and a manufacturing method of the thin-film capacitor. This is a counterpart of and claims priority to Japanese Patent Application No. 2004-256218 filed on Sep. 2, 2004, which is herein incorporated by reference.

2. Description of the Related Art

Along with demands for miniaturization, higher performance and high frequency of electronics devices in recent years, research and development of miniaturization and higher performance have been prompted with respect to electronic components mounted in the electronic devices. In particular, there is the necessity of disposing a lot more of the electronic components in a limited region in order to realize the higher performance. In general, the electronic components are mounted on a substrate. The electronic devices include integrated circuit devices. The integrated circuit devices are mounted on a printed circuit board and are sealed by resin. Alternatively, the integrated circuit devices may be mounted on the printed circuit board substantially without being sealed by the resin. The integrated circuit devices include many circuits which have various functions realized by combining a plurality of electronic elements such as transistors. The electronic elements include capacitors. Meanwhile, along with the above-described demands for the miniaturization, the higher performance and the high frequency of the electronics devices, there is the necessity of reducing size and thickness of the integrated circuit devices and mounting the integrated circuit devices which have the high performance and improved high-frequency properties. That is, it is desired that the size and the thickness of the integrated circuit devices are further reduced while the number of the integrated circuit devices is increased and structures of the integrated circuit device are made multilayered, in order to realize the miniaturization, the higher performance and the high frequency of the integrated circuit devices. The capacitors, which are used for the electronic devices with the above-described demands fulfilled, include thin-film capacitors. The thin-film capacitor includes a lower electrode film disposed over the substrate, a high dielectric film and an upper electrode film which are stacked.

Since the thin-film capacitor has the above-described laminated structure, film separation may occur due to a stress of each film in the thin-film capacitor, depending on the sizes of each of the lower electrode film, the high dielectric film and the upper electrode film. In order to ensure adhesiveness between the films in the thin-film capacitor, an adhesive film has been disposed between the films, or one high-capacity capacitor has been configured by a plurality of small-sized capacitors coupled in parallel to each other through aluminum wirings. However, since the one high-capacity capacitor has high resistivity due to resistances in the aluminum wirings, the high-frequency property of the capacitor might deteriorate. Furthermore, another thin-film capacitor is described in a Patent document 1 (Japanese Patent Publication Laid-open No. Hei 10-189389). The thin-film capacitor described in the Patent document 1 includes a first electrode film disposed on a substrate, a high dielectric film disposed on the first electrode film and a second electrode film disposed on the high dielectric film. That is, the high dielectric film is disposed between the first and second electrode films. Also, the first and second electrode films of the thin-film capacitor described in the Patent Document 1 respectively include a plurality of slit portions which intersect with each other at a predetermined relative angle, in order to reduce inductance in the thin-film capacitor. When the first electrode film described in the Patent Document 1 includes the slit portions, adhesiveness may be improved between the first electrode film and the high dielectric film or between the first electrode film and an insulating film disposed under the first electrode film, to some extent.

However, in the thin-film capacitor as described in the Patent Document 1, all of the slit portions are arranged from one side (i.e., from two sides of the first rectangular electrode film which cross each other at right angles) toward the other side (other two sides which face the above-described two sides). Therefore, electrical current may not flow smoothly in regions between the slit portions of the first electrode film. As a result, the resistivity of the first electrode film increases, and then the high-frequency property of the thin-film capacitor may deteriorate. In addition, similar phenomena may occur in the second electrode film. That is, the thin-film capacitor as described in the Patent Document 1 has limitations to improve the high-frequency property.

Furthermore, each end of the slit portions of the thin-film capacitor has a sharp angle at a central side of the first electrode film. Therefore, during the manufacturing processes of the thin-film capacitor, a void filled with gas may occur at each end of the slit portions. When the gas in the voids expand by heat treatment during the manufacturing processes, film separation may occur between the first electrode film and the insulating film or between the first electrode film and the high dielectric film. Likewise, film separation may occur between the second electrode film and the high dielectric film. That is, the thin-film capacitor as described in the Patent Document 1 has difficulty improving the adhesiveness in the first electrode film, the high dielectric film and the second electrode film.

SUMMARY OF THE INVENTION

An object of the present invention is to improve the adhesiveness in the thin-film capacitor and the adhesiveness between the thin-film capacitor and the other film and to improve the high-frequency property of the thin-film capacitor.

According to an aspect of the present invention, for achieving the above-mentioned object, there is provided a thin-film capacitor which includes a substrate, a lower electrode film, a high dielectric film and an upper electrode film. The lower electrode film is disposed over a principal surface of the substrate. The high dielectric film is disposed on the lower electrode film. The upper electrode film is disposed on the high dielectric film. One film of the lower electrode film, the high dielectric film and the upper electrode film includes a first edge portion and a second edge portion which is placed opposite to the first edge portion. Furthermore, the one film includes a first opening which extends from the first edge portion toward the second edge portion and a second opening which extends from the second edge portion toward the first edge portion. Also, the first opening is terminated away from the second edge portion and the second opening is terminated away from the first edge portion.

According to another aspect of the present invention, for achieving the above-mentioned object, there is provided a thin-film capacitor which includes a substrate, a lower electrode film, a high dielectric film and an upper electrode film. The lower electrode film is disposed over a principal surface of the substrate. The high dielectric film is disposed on the lower electrode film. The upper electrode film is disposed on the high dielectric film. One film of the lower electrode film, the high dielectric film and the upper electrode film includes a plurality of edge portions which configure an outline of the one film. Furthermore, the one film further includes a plurality of openings which respectively extend therethrough and which are terminated away from all of the edge portions.

According to the other aspect of the present invention, for achieving the above-mentioned object, there is provided a manufacturing method of a thin-film capacitor. In the method, a substrate which includes a principal surface is provided, and then a lower electrode film is formed over the principal surface of the substrate. A high dielectric film is formed on the lower electrode film. An upper electrode film is formed on the high dielectric film. One film of the lower electrode film, the high dielectric film and the upper electrode film is formed to include a plurality of openings during patterning of the one film to form an outline of the one film.

The above and further aspects and novel features of the invention will more fully appear from the following detailed description, appended claims and the accompanying drawings.

DETAILED DESCRIPTION OF THE PREFERRED EMBODIMENTS

Embodiments of the present invention will be described hereinafter with reference to the accompanying drawings. The drawings used for this description illustrate major characteristic parts of embodiments in order that the present invention will be easily understood. However, the invention is not limited by these drawings.

Figure 1:
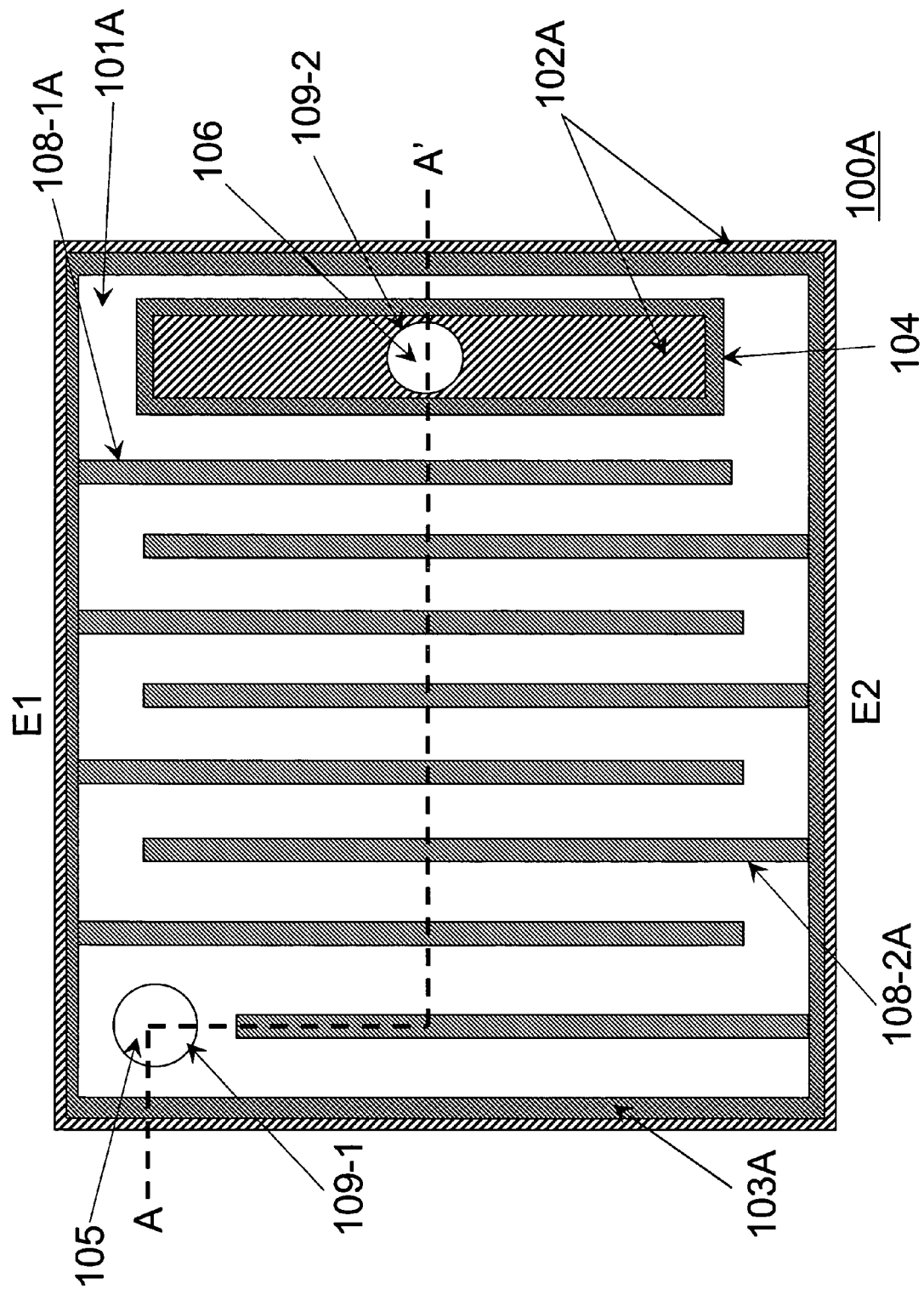
FIG. 1 is a schematic top view for describing a thin-film capacitor according to a first preferred embodiment of the present invention.
Figure 2:
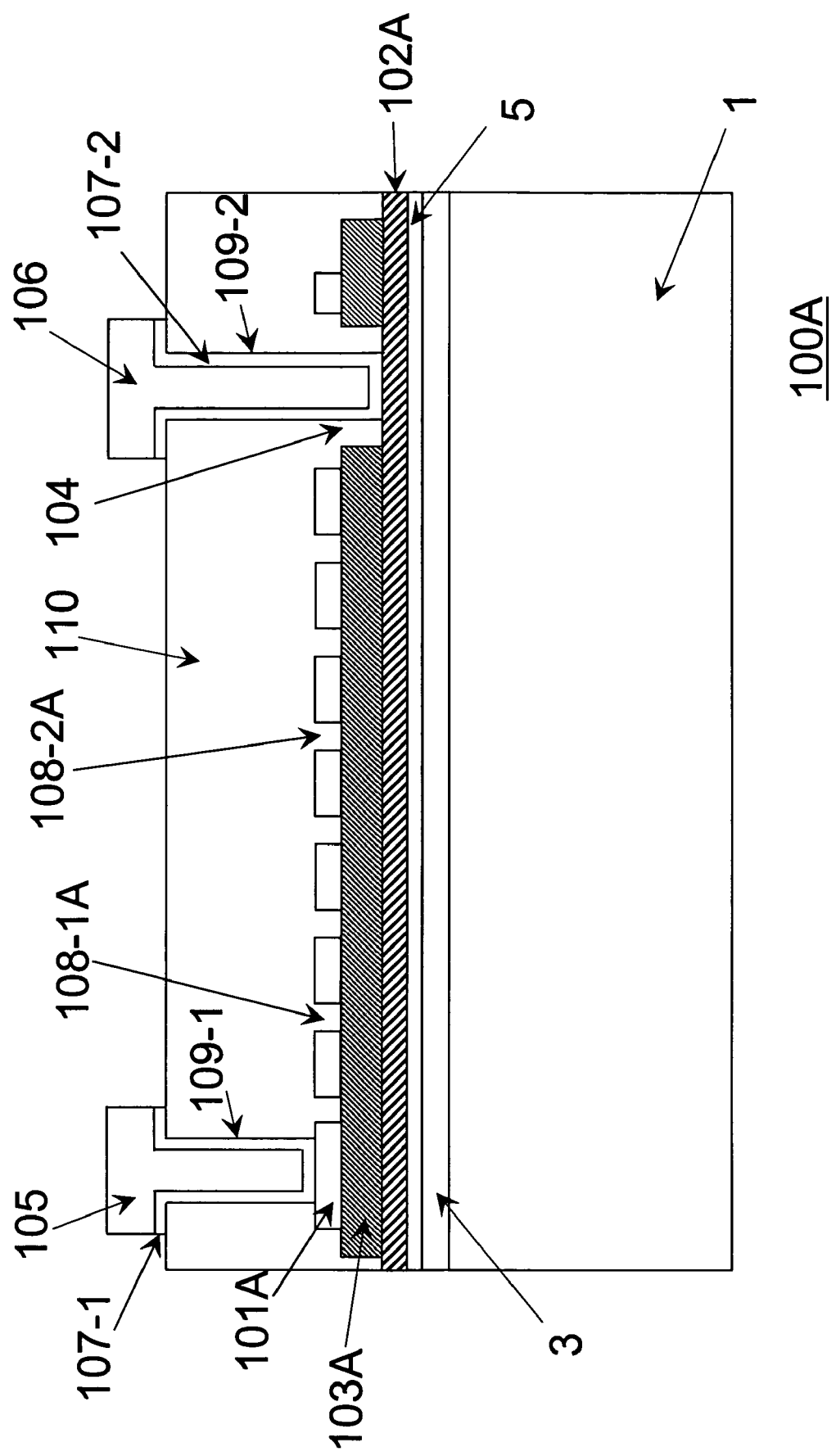
FIG. 2 is a schematic sectional view along a dashed line A-A' of the thin-film capacitor in FIG. 1.

FIG. 1 is a schematic top view for describing a thin-film capacitor 100A according to a first preferred embodiment of the present invention. FIG. 2 is a schematic sectional view along a dashed line A-A' of the thin-film capacitor 100A in FIG. 1. In FIG. 1, interlayer insulating film 110 and barrier film 107 are omitted so that the features of the present invention can be clearly shown.

The thin-film capacitor 100A includes a lower electrode film 102A, a high dielectric film 103A and an upper electrode film 101A. The lower electrode film 102A is disposed over a principal surface of a substrate 1 through an insulating film 3 and an adhesive film 5. The high dielectric film 103A is disposed on the lower electrode film 102A, and the upper electrode film 101A is disposed on the high dielectric film 103A. The interlayer insulating film 110 is disposed over the principal surface of the substrate 1 in order to cover the lower electrode film 102A, the high dielectric film 103A and the upper electrode film 101A. The interlayer insulating film 110 includes a first contact hole 109-1 and a second contact hole 109-2 therein. The first contact hole 109-1 is filled with a first barrier film 107-1 and a first interconnection film 105. The first interconnection film 105 is electrically coupled to the upper electrode film 101A through the first barrier film 107-1. The second contact hole 109-2 is filled with a second barrier film 107-2 and a second interconnection film 106. The second interconnection film 106 is electrically coupled to the lower electrode film 102A through the second barrier film 107-2.

In the thin-film capacitor 100A of the present invention, the upper electrode film 101A includes a first edge portion E1 and a second edge portion E2 and further includes a plurality of first openings 108-1A and a plurality of second openings 108-2A. The first and second openings 108-1A and 108-2A may be slit-shaped. The first edge portion E1 is placed opposite to the second edge portion E2. The upper electrode film 101A may be configured by four edge portions which includes the first and second edge portions E1 and E2. That is, the upper electrode film 101A may be rectangular. The first openings 108-1A extend from the first edge portion E1 toward the second edge portion E2 and extend perpendicular to the first edge portion E1. The first openings 108-1A are terminated near the second edge portion E2. Each of the terminated ends of the first openings 108-1A may have a curved end portion instead of a squared end portion. The second openings 108-2A extend from the second edge portion E2 toward the first edge portion E1 and extend perpendicular to the second edge portion E2. The second openings 108-2A are terminated near the first edge portion E2. Each of the terminated ends of the second openings 108-2A may have a curved end portion instead of a squared end portion. The first openings 108-1A and the second openings 108-2A are alternatively arranged along the first edge portion E1 and the second edge portion E2. That is, the upper electrode film 101A which includes the above-described first and second openings 108-1A and 108-2A is windingly configured. The thin-film capacitor 100A is covered by the interlayer insulating film 110 so that the first and second openings 108-1A and 108-2A are filled with the interlayer insulating film 110. The upper electrode film 101A includes regions in which the first and second openings 108-1A and 108-2A do not extend so that the first and second interconnection films 105 and 106 are disposed in the regions, that is, so that the first and second contact holes 109-1 and 109-2 are arranged inside the upper electrode film 101A. The first contact hole 109-1 is arranged near the first edge portion E1. The second contact hole 109-2 is arranged in between the first edge portion E1 and the second edge portion E2. Furthermore, the upper electrode film 101A and the high dielectric film 103A include a contact opening 104 which surrounds the second contact hole 109-2. The contact opening 104 is terminated in the upper electrode region 101A.

Since the thin-film capacitor 100A includes the first and second openings 108-1A and 108-2A in the upper electrode film 101A as described above, the first and second openings 108-1A and 108-2A are filled with the interlayer insulating film 110. Therefore, adhesiveness between the upper electrode film 101A and the interlayer insulating film 110 may be more improved. Furthermore, the first opening 108-1A extends from the first edge portion E1 toward the second edge portion E2 and the second opening 108-2A extends from the second edge portion E2 toward the first edge portion E1. That is, the upper electrode film 101A which includes the first and second openings 108-1A and 108-2A is windingly configured. Therefore, the electrical current may flow smoothly in regions between the first openings 108-1A and the second openings 108-2A of the upper electrode film 101A. As a result, the resistivity of the upper electrode film 101A may be suppressed from increasing, and then the high-frequency property of the thin-film capacitor 100A may be suppressed from deteriorating.

Figure 3:
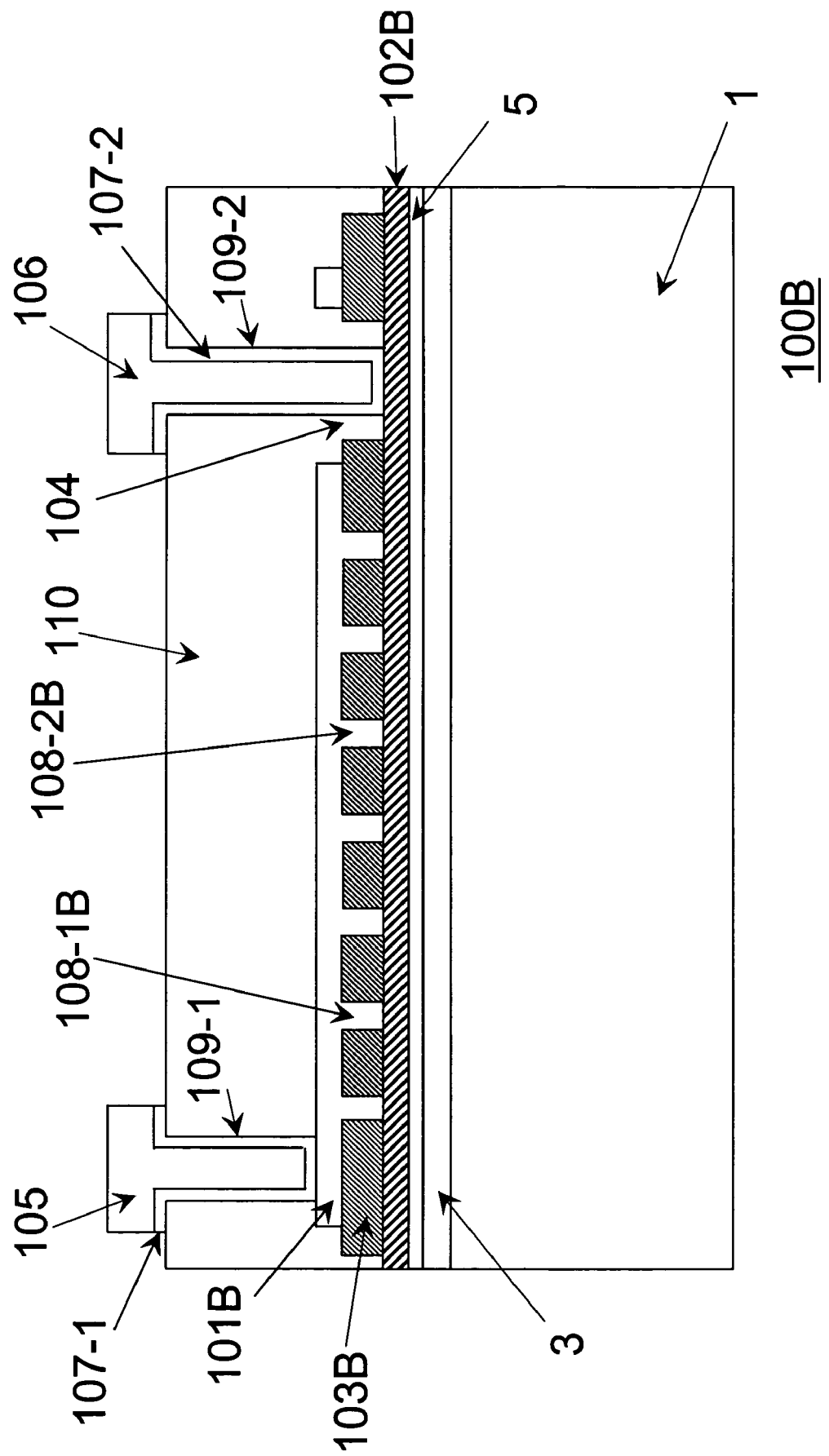
FIG. 3 is a schematic sectional view for describing another thin-film capacitor according to the first preferred embodiment of the present invention.

FIG. 3 is a schematic sectional view for describing another thin-film capacitor 100B according to the first preferred embodiment of the present invention. The thin-film capacitor 100B includes a lower electrode film 102B, a high dielectric film 103B and an upper electrode film 101B different than those of the thin-film capacitor 100A. The other features of the thin-film capacitor 100B are the same as those of the thin-film capacitor 100A. The lower electrode film 102B is disposed over the principal surface of the substrate 1 through the insulating film 3 and the adhesive film 5. The high dielectric film 103B is disposed on the lower electrode film 102B, and the upper electrode film 101B is disposed on the high dielectric film 103B.

In the thin-film capacitor 100B, the high dielectric film 103B includes the first and second edge portions E1 and E2 as shown in FIG. 1 and further includes a plurality of first openings 108-1B and a plurality of second openings 108-2B which are respectively similar to the first and second openings 108-1A and 108-2A in the thin-film capacitor 100A. The first openings 108-1B extend from the first edge portion E1 toward the second edge portion E2 and extend perpendicular to the first edge portion E1. The first openings 108-1B are terminated near the second edge portion E2. Each of the terminated ends of the first openings 108-1B may have a curved end portion instead of a squared end portion. The second openings 108-2B extend from the second edge portion E2 toward the first edge portion E1 and extend perpendicular to the second edge portion E2. The second openings 108-2B are terminated near the first edge portion E2. Each of the terminated ends of the second openings 108-2B may have a curved end portion instead of a squared end portion. The first openings 108-1B and the second openings 108-2B are alternatively arranged along the first edge portion E1 and the second edge portion E2. That is, the high dielectric film 103B which includes the above-described first and second openings 108-1B and 108-2B is windingly configured. The first and second openings 108-1B and 108-2B are filled with the upper electrode film 101B.

Since the thin-film capacitor 100B includes the first and second openings 108-1B and 108-2B in the high dielectric film 103B as described above, the first and second openings 108-1B and 108-2B are filled with the upper electrode film 101B. Therefore, adhesiveness between the upper electrode film 101B and the high dielectric film 103B may be more improved.

Figure 4:
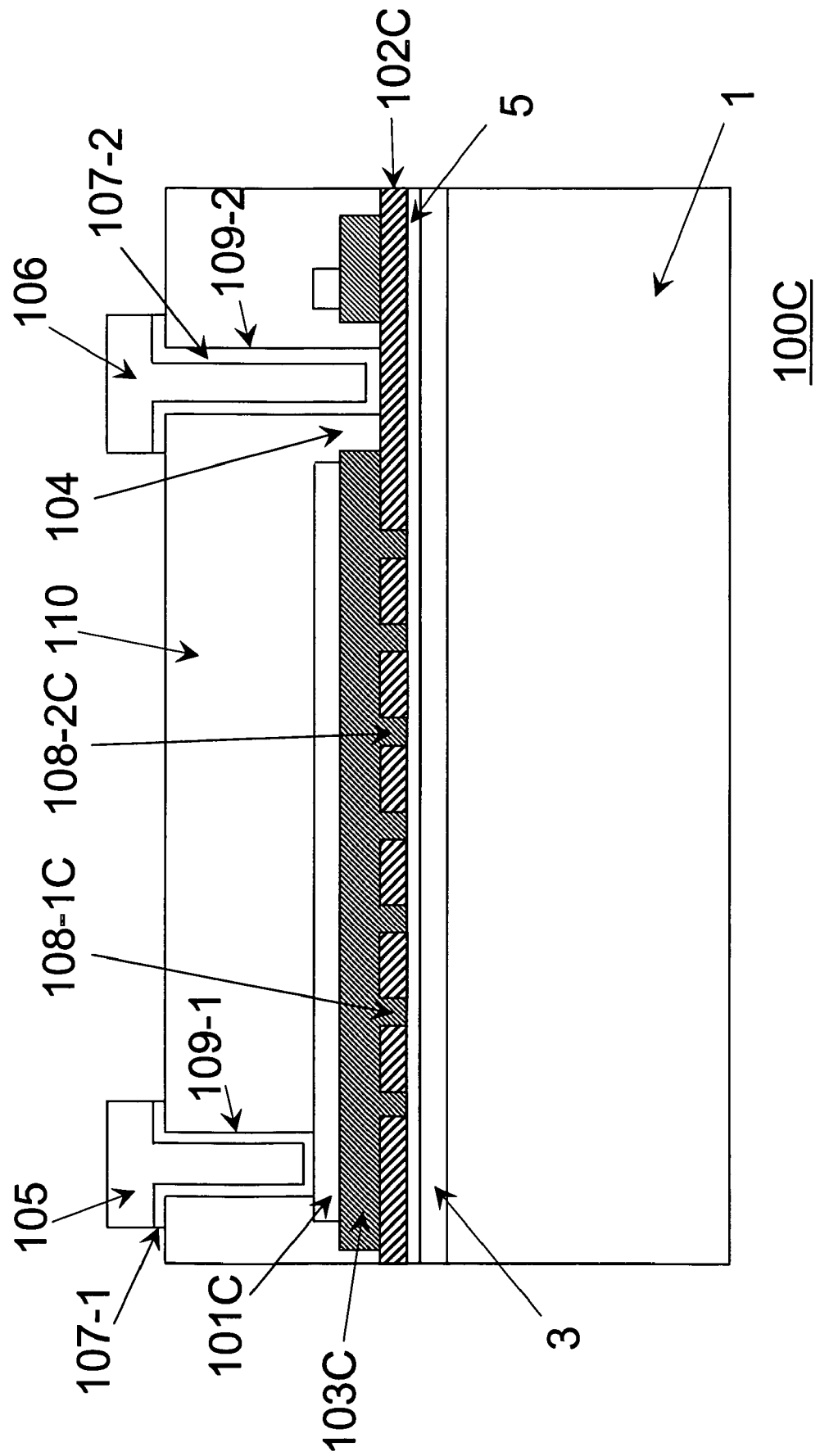
FIGS. 4 through 9 are schematic sectional views for describing the other thin-film capacitors according to the first preferred embodiment of the present invention.

FIG. 4 is a schematic sectional view for describing another thin-film capacitor 100C according to the first preferred embodiment of the present invention. The thin-film capacitor 100C includes a lower electrode film 102C, a high dielectric film 103C and an upper electrode film 101C different than those of the thin-film capacitor 100A. The other features of the thin-film capacitor 100C are the same as those of the thin-film capacitor 100A. The lower electrode film 102C is disposed over the principal surface of the substrate 1 through the insulating film 3 and the adhesive film 5. The high dielectric film 103C is disposed on the lower electrode film 102C, and the upper electrode film 101C is disposed on the high dielectric film 103C.

In the thin-film capacitor 100C, the lower electrode film 102C includes the first and second edge portions E1 and E2 as shown in FIG. 1 and further includes a plurality of first openings 108-1C and a plurality of second openings 108-2C which are respectively similar to the first and second openings 108-1A and 108-2A in the thin-film capacitor 100A. The first openings 108-1C extend from the first edge portion E1 toward the second edge portion E2 and extend perpendicular to the first edge portion E1. The first openings 108-1C are terminated near the second edge portion E2. Each of the terminated ends of the first openings 108-1C may have a curved end portion instead of a squared end portion. The second openings 108-2C extend from the second edge portion E2 toward the first edge portion E1 and extend perpendicular to the second edge portion E2. The second openings 108-2C are terminated near the first edge portion E2. Each of the terminated ends of the second openings 108-2C may have a curved end portion instead of a squared end portion. The first openings 108-1C and the second openings 108-2C are alternatively arranged along the first edge portion E1 and the second edge portion E2. That is, the lower electrode film 102C which includes the above-described first and second openings 108-1C and 108-2C is windingly configured. The first and second openings 108-1C and 108-2C are filled with the high dielectric film 103C.

Since the thin-film capacitor 100C includes the first and second openings 108-1C and 108-2C in the lower electrode film 102C as described above, the first and second openings 108-1C and 108-2C are filled with the high dielectric film 103C. Therefore, adhesiveness between the lower electrode film 102C and the high dielectric film 103C may be more improved. Furthermore, the first opening 108-1C extends from the first edge portion E1 toward the second edge portion E2 and the second opening 108-2C extends from the second edge portion E2 toward the first edge portion E1. That is, the lower electrode film 102C which includes the first and second openings 108-1C and 108-2C is windingly configured. Therefore, the electrical current may flow smoothly in regions between the first openings 108-1C and the second openings 108-2C of the lower electrode film 102C. As a result, the resistivity of the lower electrode film 102C may be suppressed from increasing, and then the high-frequency property of the thin-film capacitor 100C may be suppressed from deteriorating.

Figure 5:
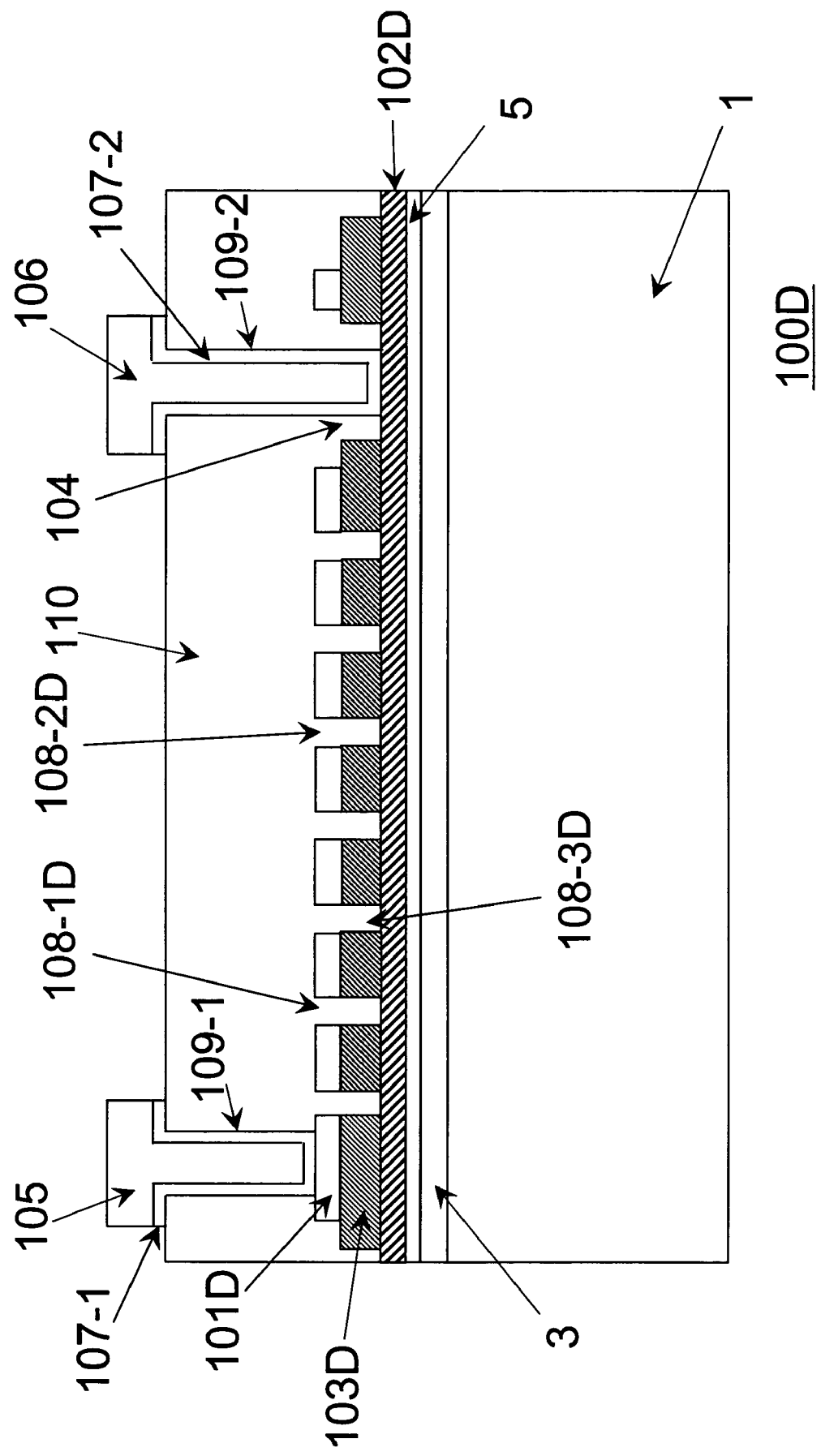

FIG. 5 is a schematic sectional view for describing another thin-film capacitor 100D according to the first preferred embodiment of the present invention. The thin-film capacitor 100D includes a lower electrode film 102D, a high dielectric film 103D and an upper electrode film 101D different than those of the thin-film capacitor 100A. The other features of the thin-film capacitor 100D are the same as those of the thin-film capacitor 100A. The lower electrode film 102D is disposed over the principal surface of the substrate 1 through the insulating film 3 and the adhesive film 5. The high dielectric film 103D is disposed on the lower electrode film 102D, and the upper electrode film 101D is disposed on the high dielectric film 103D.

In the thin-film capacitor 100D, the upper electrode film 101D includes the first and second edge portions E1 and E2 as shown in FIG. 1 and further includes a plurality of first openings 108-1D and a plurality of second openings 108-2D which are respectively similar to the first and second openings 108-1A and 108-2A in the thin-film capacitor 100A. The first openings 108-1D extend from the first edge portion E1 toward the second edge portion E2 and extend perpendicular to the first edge portion E1. The first openings 108-1D are terminated near the second edge portion E2. Each of the terminated ends of the first openings 108-1D may have a curved end portion instead of a squared end portion. The second openings 108-2D extend from the second edge portion E2 toward the first edge portion E1 and extend perpendicular to the second edge portion E2. The second openings 108-2D are terminated near the first edge portion E1. Each of the terminated ends of the second openings 108-2D may have a curved end portion instead of a squared end portion. The first openings 108-1D and the second openings 108-2D are alternatively arranged along the first edge portion E1 and the second edge portion E2. That is, the upper electrode film 101D which includes the above-described first and second openings 108-1D and 108-2D is windingly configured. Furthermore, the high dielectric film 103D includes a plurality of third openings 108-3D which are similar to the first and second openings 108-1D and 108-2D. That is, the third openings 108-3D are arranged in the high dielectric film 103D so as to coincide or be aligned with the first and second openings 108-1D and 108-2D from the top view. The first through third openings 108-1D through 108-3D are filled with the interlayer insulating film 110.

Since the thin-film capacitor 100D includes the first and second openings 108-1D and 108-2D in the upper electrode film 101D and further includes the third openings 108-3D in the high dielectric film 103D as described above, the first through third openings 108-1D through 108-3D are filled with the interlayer insulating film 110. Therefore, adhesiveness between the upper electrode film 101D and the interlayer insulating film 110 may be more improved, and adhesiveness between the high dielectric film 103D and the interlayer insulating film 110 may be more improved. Furthermore, the first opening 108-1D extends from the first edge portion E1 toward the second edge portion E2 and the second opening 108-2D extends from the second edge portion E2 toward the first edge portion E1. That is, the upper electrode film 101D which includes the first and second openings 108-1D and 108-2D is windingly configured. Therefore, the electrical current may flow smoothly in regions between the first openings 108-1D and the second openings 108-2D of the upper electrode film 101D. As a result, the resistivity of the upper electrode film 101D may be suppressed from increasing, and then the high-frequency property of the thin-film capacitor 100D may be suppressed from deteriorating.

Figure 6:
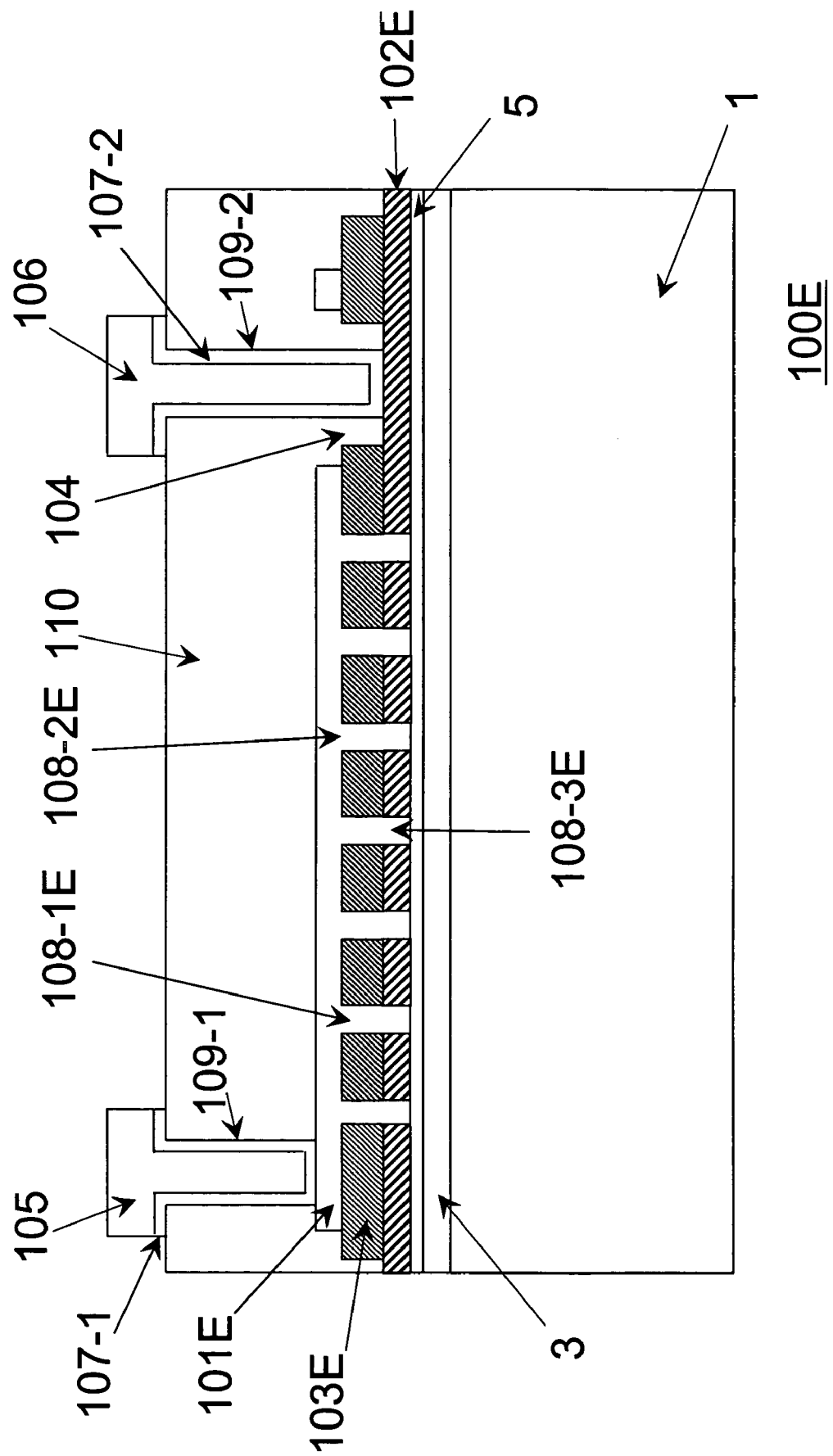

FIG. 6 is a schematic sectional view for describing another thin-film capacitor 100E according to the first preferred embodiment of the present invention. The thin-film capacitor 100E includes a lower electrode film 102E, a high dielectric film 103E and an upper electrode film 101E different than those of the thin-film capacitor 100A. The other features of the thin-film capacitor 100E are the same as those of the thin-film capacitor 100A. The lower electrode film 102E is disposed over the principal surface of the substrate 1 through the insulating film 3 and the adhesive film 5. The high dielectric film 103E is disposed on the lower electrode film 102E, and the upper electrode film 101E is disposed on the high dielectric film 103E.

In the thin-film capacitor 100E, the high dielectric film 103E includes the first and second edge portions E1 and E2 as shown in FIG. 1 and further includes a plurality of first openings 108-1E and a plurality of second openings 108-2E which are respectively similar to the first and second openings 108-1A and 108-2A in the thin-film capacitor 100A. The first openings 108-1E extend from the first edge portion E1 toward the second edge portion E2 and extend perpendicular to the first edge portion E1. The first openings 108-1E are terminated near the second edge portion E2. Each of the terminated ends of the first openings 108-1E may have a curved end portion instead of a squared end portion. The second openings 108-2E extend from the second edge portion E2 toward the first edge portion E1 and extend perpendicular to the second edge portion E2. The second openings 108-2E are terminated near the first edge portion E2. Each of the terminated ends of the second openings 108-2E may have a curved end portion instead of a squared end portion. The first openings 108-1E and the second openings 108-2E are alternatively arranged along the first edge portion E1 and the second edge portion E2. That is, the high dielectric film 103E which includes the above-described first and second openings 108-1E and 108-2E is windingly configured. Furthermore, the lower electrode film 102E includes a plurality of third openings 108-3E which are similar to the first and second openings 108-1E and 108-2E. That is, the third openings 108-3E are arranged in the lower electrode film 102E so as to coincide with the first and second openings 108-1E and 108-2E from the top view. The first through third openings 108-1E through 108-3E are filled with the upper electrode film 101E.

Since the thin-film capacitor 100E includes the first and second openings 108-1E and 108-2E in the high dielectric film 103E and further includes the third openings 108-3E in the lower electrode film 102E as described above, the first through third openings 108-1E through 108-3E are filled with the upper electrode film 101E. Therefore, adhesiveness between the upper electrode film 101E and the high dielectric film 103E may be more improved, and adhesiveness between the upper electrode film 101E and the lower electrode film 102E may be more improved. Furthermore, the first opening 108-1E extends from the first edge portion E1 toward the second edge portion E2 and the second opening 108-2E extends from the second edge portion E2 toward the first edge portion E1, and also the third openings 108-3E are similar to the first and second openings 108-1E and 108-2E. That is, the lower electrode film 102E which includes the third openings 108-3E is windingly configured. Therefore, the electrical current may flow smoothly in regions between the third openings 108-3E of the lower electrode film 102E. As a result, the resistivity of the lower electrode film 102E may be suppressed from increasing, and then the high-frequency property of the thin-film capacitor 100E may be suppressed from deteriorating.

Figure 7:
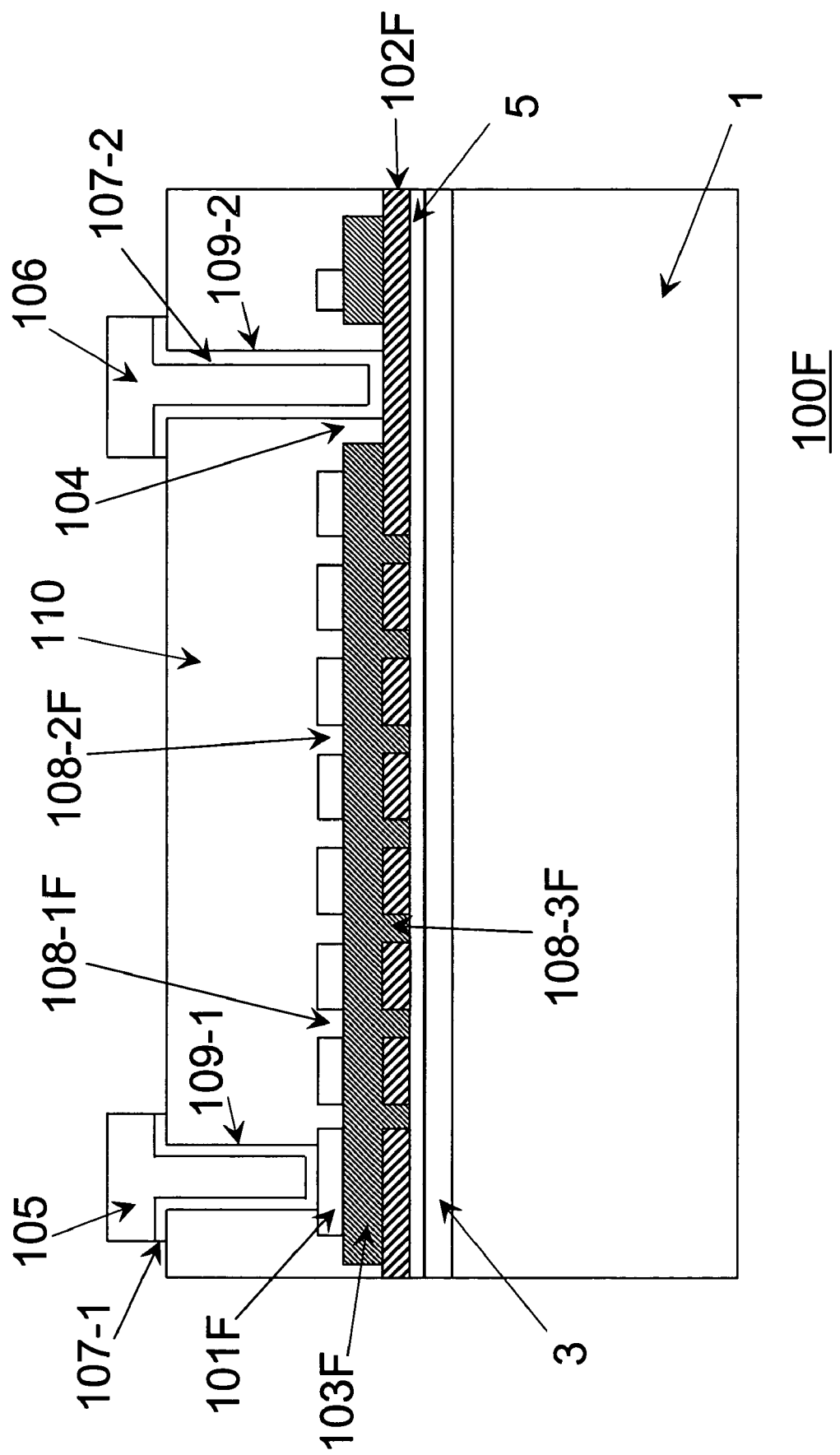

FIG. 7 is a schematic sectional view for describing another thin-film capacitor 100F according to the first preferred embodiment of the present invention. The thin-film capacitor 100F includes a lower electrode film 102F, a high dielectric film 103F and an upper electrode film 101F different than those of the thin-film capacitor 100A. The other features of the thin-film capacitor 100F are the same as those of the thin-film capacitor 100A. The lower electrode film 102F is disposed over the principal surface of the substrate 1 through the insulating film 3 and the adhesive film 5. The high dielectric film 103F is disposed on the lower electrode film 102F, and the upper electrode film 101F is disposed on the high dielectric film 103F.

In the thin-film capacitor 100F, the upper electrode film 101F includes the first and second edge portions E1 and E2 as shown in FIG. 1 and further includes a plurality of first openings 108-1F and a plurality of second openings 108-2F which are respectively similar to the first and second openings 108-1A and 108-2A in the thin-film capacitor 100A. The first openings 108-1F extend from the first edge portion E1 toward the second edge portion E2 and extend perpendicular to the first edge portion E1. The first openings 108-1F are terminated near the second edge portion E2. Each of the terminated ends of the first openings 108-1F may have a curved end portion instead of a squared end portion. The second openings 108-2F extend from the second edge portion E2 toward the first edge portion E1 and extend perpendicular to the second edge portion E2. The second openings 108-2F are terminated near the first edge portion E1. Each of the terminated ends of the second openings 108-2F may have a curved end portion instead of a squared end portion. The first openings 108-1F and the second openings 108-2F are alternatively arranged along the first edge portion E1 and the second edge portion E2. That is, the upper electrode film 101F which includes the above-described first and second openings 108-1F and 108-2F is windingly configured. Furthermore, the lower electrode film 102F includes a plurality of third openings 108-3F which are similar to the first and second openings 108-1F and 108-2F. That is, the third openings 108-3F are arranged in the lower electrode film 102F so as to coincide and be aligned with the first and second openings 108-1F and 108-2F from the top view. The first and second openings 108-1F and 108-2F are filled with the interlayer insulating film 110, and the third openings 108-3F are filled with the high dielectric film 103F.

Since the thin-film capacitor 100F includes the first and second openings 108-1F and 108-2F in the upper electrode film 101F and further includes the third openings 108-3F in the lower electrode film 102F as described above, the first and second openings 108-1F and 108-2F are filled with the interlayer insulating film and the third openings 108-3F are filled with the high dielectric film 103F. Therefore, adhesiveness between the upper electrode film 101F and the interlayer insulating film 110 may be more improved, and adhesiveness between the high dielectric film 103F and the lower electrode film 102F may be more improved. Furthermore, the first opening 108-1F extends from the first edge portion E1 toward the second edge portion E2 and the second opening 108-2F extends from the second edge portion E2 toward the first edge portion E1. That is, the upper electrode film 101F which includes the first and second openings 108-1F and 108-2F is windingly configured. Also, the third openings 108-3F are similar to the first and second openings 108-1F and 108-2F. That is, the lower electrode film 102F which includes the third openings 108-3F is windingly configured. Therefore, the electrical current may flow smoothly in regions between the first openings 108-1F and the second openings 108-2F of the upper electrode film 101F, and the electrical current also may flow smoothly in regions among the third openings 108-3F of the lower electrode film 102F. As a result, the resistivities of the upper electrode film 101F and the lower electrode film 102F may be suppressed from increasing, and then the high-frequency property of the thin-film capacitor 10OF may be suppressed from deteriorating.

Figure 8:
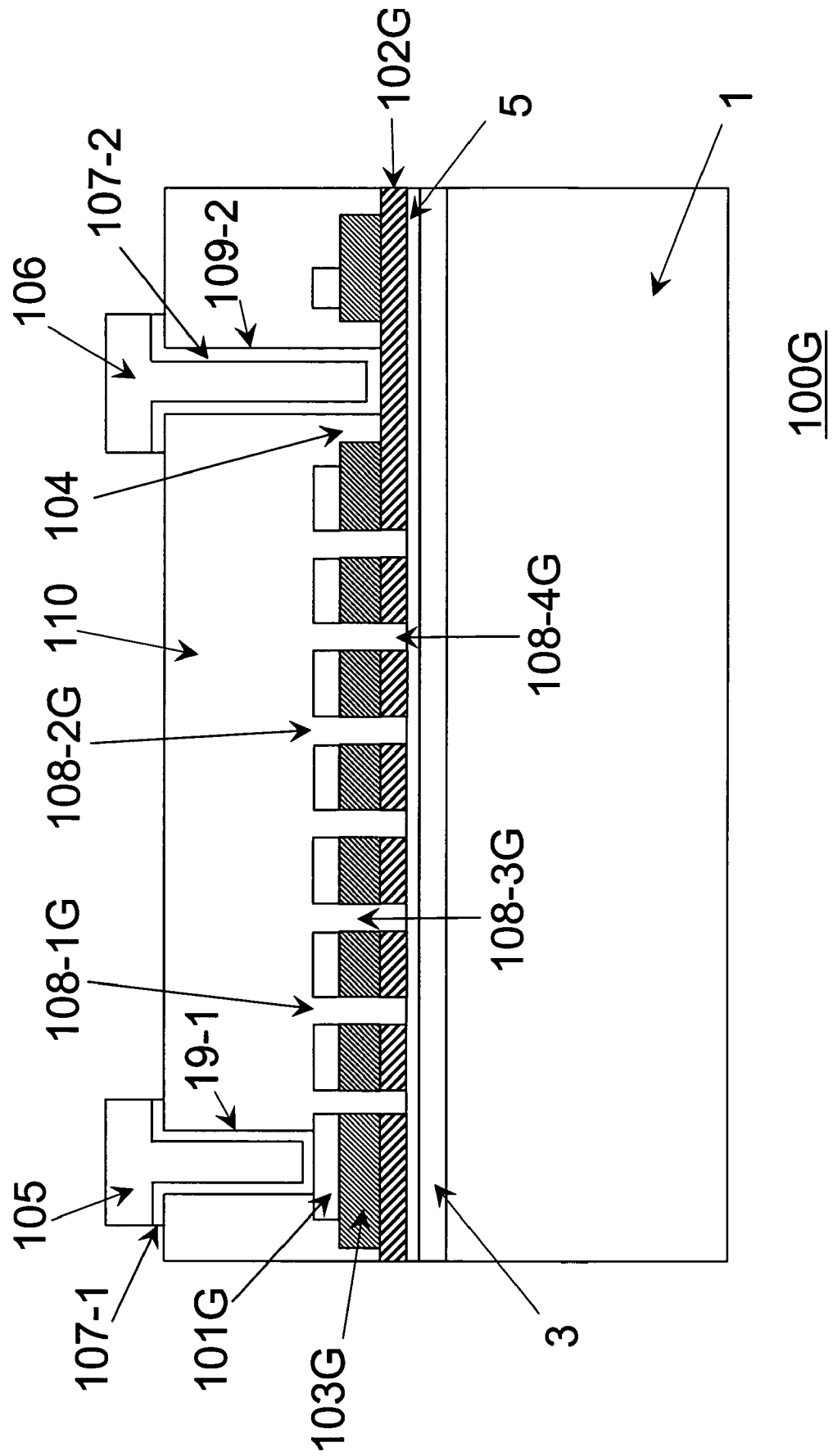

FIG. 8 is a schematic sectional view for describing another thin-film capacitor 100G according to the first preferred embodiment of the present invention. The thin-film capacitor 100G includes a lower electrode film 102G, a high dielectric film 103G and an upper electrode film 101G different than those of the thin-film capacitor 100A. The other features of the thin-film capacitor 100G are the same as those of the thin-film capacitor 100A. The lower electrode film 102G is disposed over the principal surface of the substrate 1 through the insulating film 3 and the adhesive film 5. The high dielectric film 103G is disposed on the lower electrode film 102G, and the upper electrode film 101G is disposed on the high dielectric film 103G.

In the thin-film capacitor 100G, the upper electrode film 101G includes the first and second edge portions E1 and E2 as shown in FIG. 1 and further includes a plurality of first openings 108-1G and a plurality of second openings 108-2G which are respectively similar to the first and second openings 108-1A and 108-2A in the thin-film capacitor 100A. The first openings 108-1G extend from the first edge portion E1 toward the second edge portion E2 and extend perpendicular to the first edge portion E1. The first openings 108-1G are terminated near the second edge portion E2. Each of the terminated ends of the first openings 108-1G may have a curved end portion instead of a squared end portion. The second openings 108-2G extend from the second edge portion E2 toward the first edge portion E1 and extend perpendicular to the second edge portion E2. The second openings 108-2G are terminated near the first edge portion E1. Each of the terminated ends of the second openings 108-2G may have a curved end portion instead of a squared end portion. The first openings 108-1G and the second openings 108-2G are alternatively arranged along the first edge portion E1 and the second edge portion E2. That is, the upper electrode film 101G which includes the above-described first and second openings 108-1G and 108-2G is windingly configured. Also, the high dielectric film 103G includes a plurality of third openings 108-3G which are similar to the first and second openings 108-1G and 108-2G. Furthermore, the lower electrode film 102G includes a plurality of fourth openings 108-4G which are similar to the first and second openings 108-1G and 108-2G. That is, the third openings 108-3G and the fourth openings 108-4G are arranged respectively in each of the high dielectric film 103G and the lower electrode film 102G so as to coincide and be aligned with the first and second openings 108-1G and 108-2G from the top view. The first through fourth openings 108-1G through 108-4G are filled with the interlayer insulating film 110.

Since the thin-film capacitor 100G includes the first through fourth openings 108-1G through 108-4G in the upper electrode film 101G, the high dielectric film 103G and the lower electrode film 102G as described above, the first through fourth openings 108-1G through 108-4G are filled with the interlayer insulating film 110. Therefore, adhesiveness between the thin-film capacitor 100G and the interlayer insulating film 110 may be more improved. Furthermore, the first opening 108-1G extends from the first edge portion E1 toward the second edge portion E2 and the second opening 108-2G extends from the second edge portion E2 toward the first edge portion E1. That is, the upper electrode film 101G which includes the first and second openings 108-1G and 108-2G is windingly configured. Also, the fourth openings 108-4G are similar to the first and second openings 108-1G and 108-2G. That is, the lower electrode film 102G which includes the fourth openings 108-4G is windingly configured. Therefore, the electrical current may flow smoothly in regions between the first openings 108-1G and the second openings 108-2G of the upper electrode film 101G, and the electrical current also may flow smoothly in regions among the fourth openings 108-4G of the lower electrode film 102G. As a result, the resistivities of the upper electrode film 101G and the lower electrode film 102G may be suppressed from increasing, and then the high-frequency property of the thin-film capacitor 100G may be suppressed from deteriorating.

Figure 9:
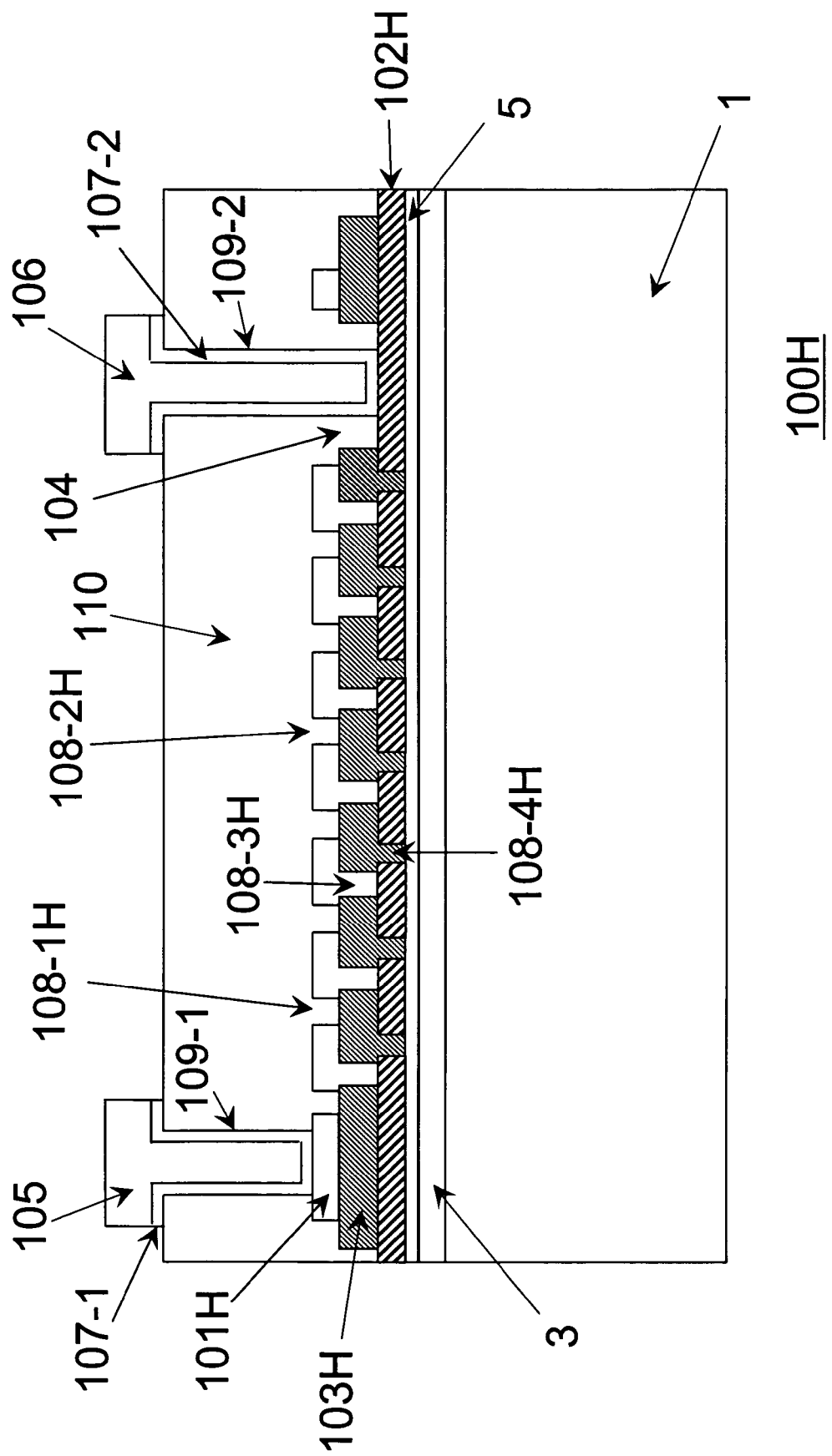

FIG. 9 is a schematic sectional view for describing another thin-film capacitor 100H according to the first preferred embodiment of the present invention. The thin-film capacitor 100H includes a lower electrode film 102H, a high dielectric film 103H and an upper electrode film 101H different than those of the thin-film capacitor 100A. The other features of the thin-film capacitor 100H are the same as those of the thin-film capacitor 100A. The lower electrode film 102H is disposed over the principal surface of the substrate 1 through the insulating film 3 and the adhesive film 5. The high dielectric film 103H is disposed on the lower electrode film 102H, and the upper electrode film 101H is disposed on the high dielectric film 103H.

In the thin-film capacitor 100H, the upper electrode film 101H includes the first and second edge portions E1 and E2 as shown in FIG. 1 and further includes a plurality of first openings 108-1H and a plurality of second openings 108-2H which are respectively similar to the first and second openings 108-1A and 108-2A in the thin-film capacitor 100H. The first openings 108-1H extend from the first edge portion E1 toward the second edge portion E2 and extend perpendicular to the first edge portion E1. The first openings 108-1H are terminated near the second edge portion E2. Each of the terminated ends of the first openings 108-1H may have a curved end portion instead of a squared end portion. The second openings 108-2H extend from the second edge portion E2 toward the first edge portion E1 and extend perpendicular to the second edge portion E2. The second openings 108-2H are terminated near the first edge portion E1. Each of the terminated ends of the second openings 108-2H may have a curved end portion instead of a squared end portion. The first openings 108-1H and the second openings 108-2H are alternatively arranged along the first edge portion E1 and the second edge portion E2. That is, the upper electrode film 101H which includes the above-described first and second openings 108-1H and 108-2H is windingly configured. Also, the high dielectric film 103H includes a plurality of third openings 108-3H which are similar to the first and second openings 108-1H and 108-2H. The third openings 108-3H are arranged in the high dielectric film 103H so as not to coincide or not be aligned with the first and second openings 108-1H and 108-2H from the top view. Furthermore, the lower electrode film 102H includes a plurality of fourth openings 108-4H which are similar to the first and second openings 108-1H and 108-2H. The fourth openings 108-4H are arranged in the lower electrode film 102H so as not to coincide or not be aligned with the first through third openings 108-1H through 108-3H from the top view. The first and second openings 108-1H and 108-2H are filled with the interlayer insulating film 110, the third openings 108-3H are filled with the upper electrode film 101H, and the fourth openings 108-4H are filled with the high dielectric film 103H. Also, one of the first through fourth openings 108-1H through 108-4H may be perpendicular to the others of the first through fourth openings 108-1H through 108-4H.

Since the thin-film capacitor 100H includes the first and second openings 108-1H and 108-2H in the upper electrode film 101H, the third openings 108-3H in the high dielectric film 103H and the fourth openings 108-4H in the lower electrode film 102H as described above, the first and second openings 108-1H and 108-2H are filled with the interlayer insulating film 110, the third openings 108-3H are filled with the upper electrode film 101H, and the fourth openings 108-4H are filled with the high dielectric film 103H. Therefore, adhesiveness between the interlayer insulating film 110 and the upper electrode film 101H, adhesiveness between the upper electrode film 101H and the high dielectric film 103H, and adhesiveness between the high dielectric film 103H and the lower electrode film 102H may be more improved. Furthermore, the first opening 108-1H extends from the first edge portion E1 toward the second edge portion E2 and the second opening 108-2H extends from the second edge portion E2 toward the first edge portion E1. That is, the upper electrode film 101H which includes the first and second openings 108-1H and 108-2H is windingly configured. Also, the fourth openings 108-4H are similar to the first and second openings 108-1H and 108-2H. That is, the lower electrode film 102H which includes the fourth openings 108-4H is windingly configured. Therefore, the electrical current may flow smoothly in regions between the first openings 108-1H and the second openings 108-2H of the upper electrode film 101H, and the electrical current also may flow smoothly in regions among the fourth openings 108-4H of the lower electrode film 102H. As a result, the resistivities of the upper electrode film 101H and the lower electrode film 102H may be suppressed from increasing, and then the high-frequency property of the thin-film capacitor 100H may be suppressed from deteriorating.

Figure 10A:
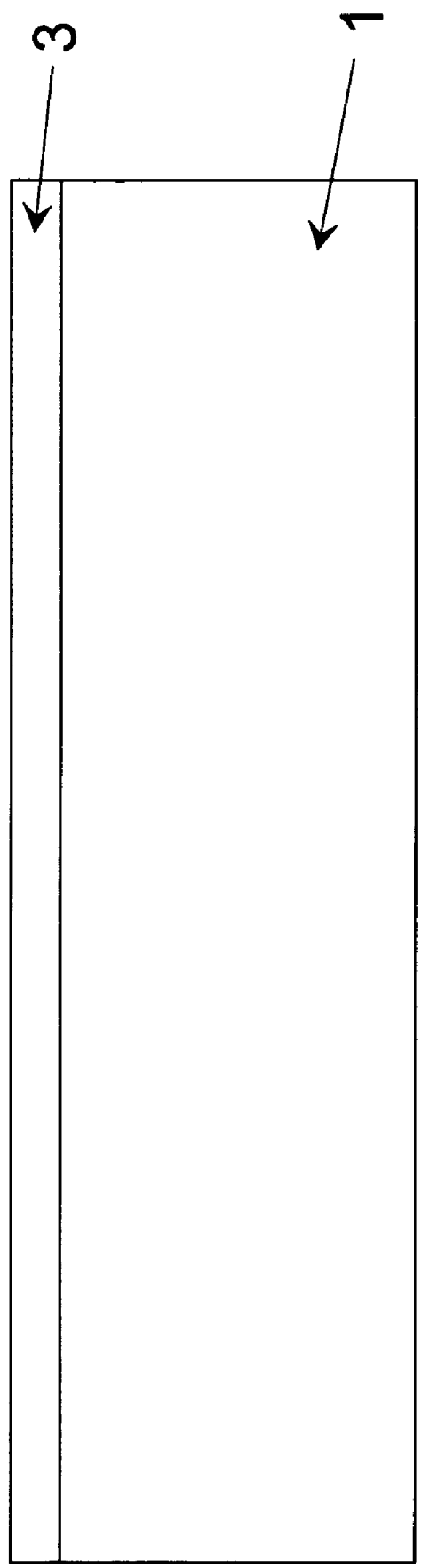
FIGS. 10A through 10F are schematic sectional views for describing processes of manufacturing the thin-film capacitor according to the first preferred embodiment of the present invention.
Figure 10B:
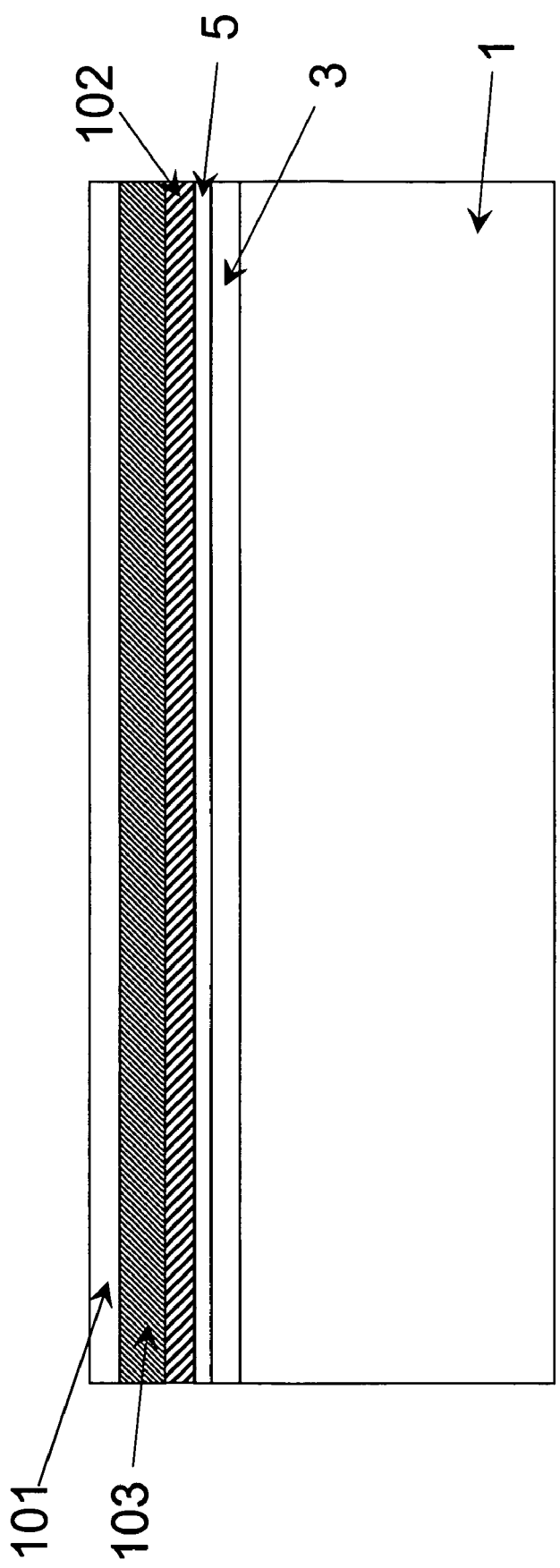

The manufacturing method of the thin-film capacitor according to the first preferred embodiment, in particular, the thin-film capacitor 100A is described below. FIGS. 10A and 10F are schematic sectional views for describing processes of manufacturing the thin-film capacitor 100A according to the first preferred embodiment of the present invention.

At first, as shown in FIG. 10A, a silicon substrate 1 such as a wafer is provided. The substrate 1 includes a principal surface. A protective oxide film is formed on the principal surface of the substrate 1 as the insulating film 3 by a thermal oxidation method at a temperature of 950 degrees centigrade. A thickness of the insulating film 3 is approximately 100 nm. Next, as shown in FIG. 10B, after the adhesive film 5 is formed on the insulating film 3, a lower electrode layer 102, a high dielectric layer 103 and an upper electrode layer 101 are sequentially formed on the adhesive film 5. The adhesive film 5 includes a tantalum oxide film formed by a reactive sputtering method. The adhesive film 5 may suppress the lower electrode layer 102 from being separated. A thickness of the adhesive film 5 is approximately 50 nm. The lower electrode layer 102 may include platinum and may be formed by a sputtering method. A thickness of the lower electrode layer 102 is approximately 150 nm. The high dielectric layer 103 may be formed by a spin coating method. A thickness of the high dielectric layer 103 is approximately 100 nm. The upper electrode layer 101 may include platinum and may be formed by the sputtering method. A thickness of the upper electrode layer 101 is approximately 150 nm.

Hereupon, the forming method of the high dielectric layer 103 is described below in more detail. First of all, a propylene glycol monomethyl ether solution which includes a barium isopropoxyd diluted with the consistency of 0.5 mol/kg and another propylene glycol monomethyl ether solution which includes titan isopropoxyd diluted with the consistency of 0.5 mol/kg are provided. After compounding both of the propylene glycol monomethyl ether solutions each of which is 1 mol, the compounded solution is evenly agitated to prepare an embrocation for the high dielectric layer 103. Then, the compounded solution is agitated for an hour, while a propylene glycol monomethyl ether solution diluted by purified water to have a twenty-times weight ratio is delivered by drops into the compounded solution. The amount of dropping corresponds to $H_2O$ which has a 3.5 times number of moles as same as number of moles of the barium and the titan. The amount of propylene glycol monomethyl ether solution is controlled so that a converted consistency of barium titanate is 0.15 mol/kg. As a result, a barium titanate solution is provided. Next, a propylene glycol monomethyl ether solution which includes a strontium isopropoxyd diluted with the consistency of 0.5 mol/kg and another propylene glycol monomethyl ether solution which includes titan isopropoxyd diluted with the consistency of 0.5 mol/kg are provided. After compounding both of the propylene glycol monomethyl ether solutions each of which is 1 mol, the compounded solution is evenly agitated to prepare an embrocation for the high dielectric layer 103. Then, the compounded solution is agitated for an hour, while a propylene glycol monomethyl ether solution diluted by purified water to have a twenty-times weight ratio is delivered by drops into the compounded solution. The amount of dropping corresponds to $H_2O$ which has a 3.5 times number of moles as same as number of moles of the strontium and the titan. The amount of propylene glycol monomethyl ether solution is controlled so that a converted consistency of strontium titanate is 0.15 mol/kg. As a result, a strontium titanate solution is provided. Thereafter, the barium titanate solution and the strontium titanate solution are compounded while a weight ratio of the barium titanate solution to the strontium titanate solution is 1.5, and then the compound solution is agitated for an hour. As a result, a sol-gel embrocation for a $Ba_xSr_{1-x}TiO_3$ layer (x=0.6) which has an oxide dissolved solid of 3.2 wt %, is provided. The above described sol-gel embrocation is applied to the lower electrode layer 102 by the spin coating method at rotating speeds of 500 rpm for one second and 2000 rpm for 30 seconds. Then, the coated sol-gel embrocation is burned at a temperature of 600 degrees centigrade. After the process from the coating to the burning is executed three times, a heat treatment is executed for an hour at a temperature of 700 degrees centigrade in the presence of oxygen, in order to improve a crystalline of the coated layer. As a result, the high dielectric layer 103 is formed on the lower electrode layer 102.

Figure 10C:
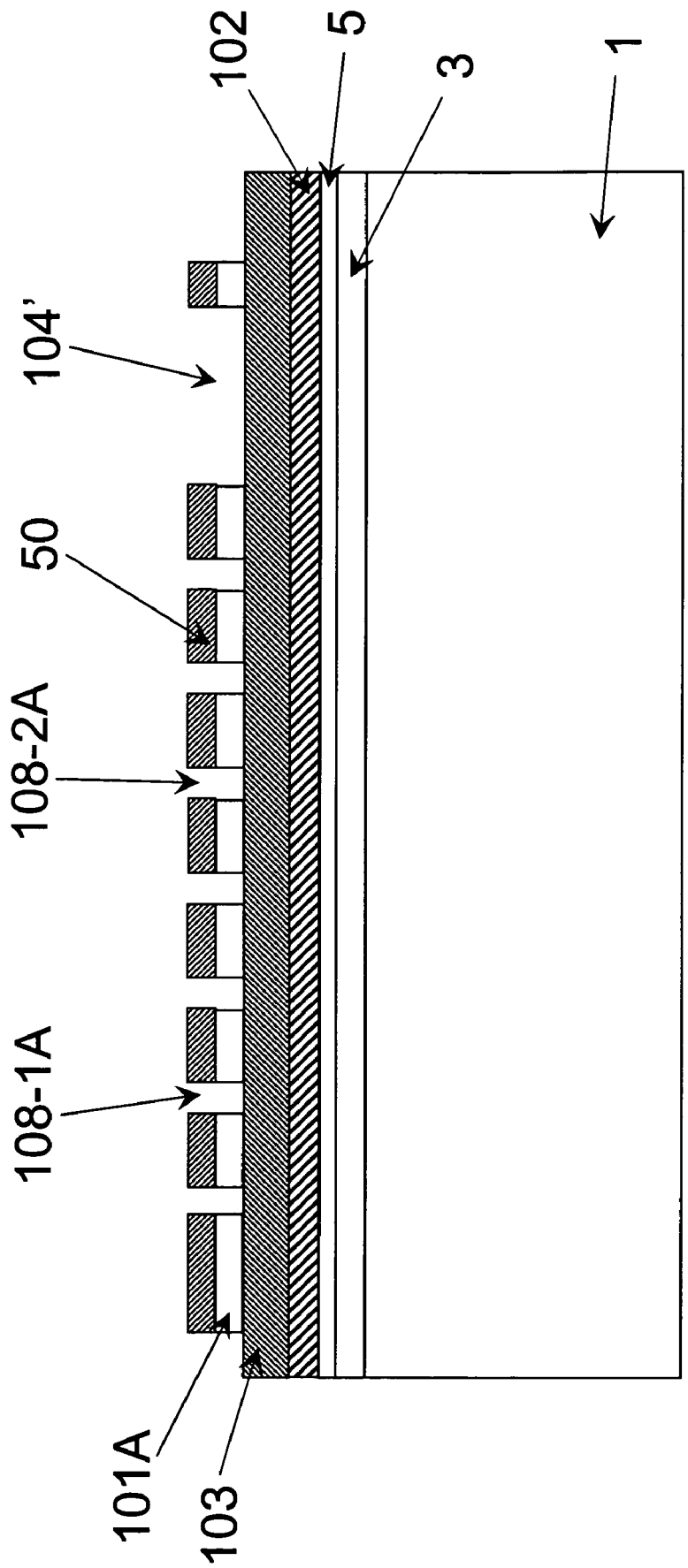
Figure 10D:
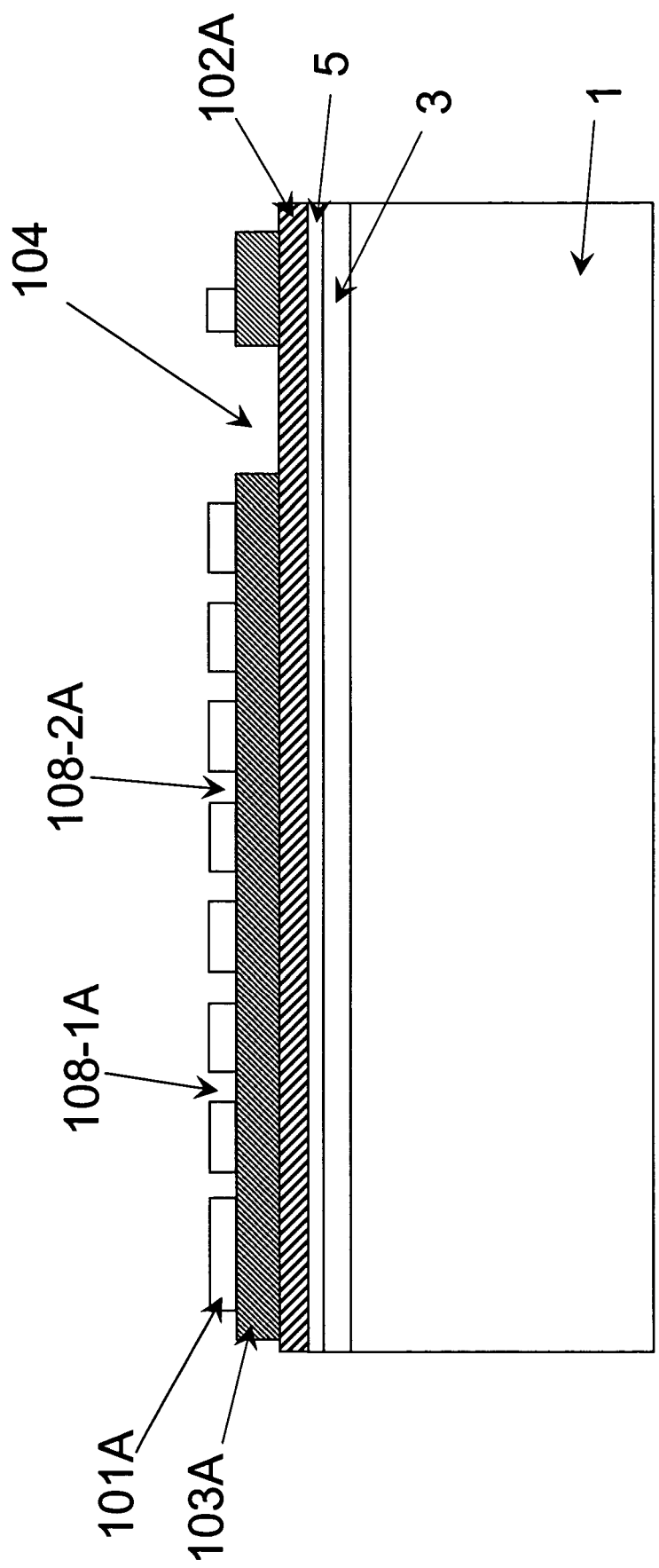

As shown in FIG. 10C, the upper electrode layer 101 is patterned by photolithography and etching methods using a resist pattern 50 as a mask, in order to form an outline of the upper electrode film 101A. At this time, a plurality of the first openings 108-1A, a plurality of the second openings 108-2A and another opening 104' are also formed in the upper electrode film 101A, using the resist pattern 50. That is, the outline of the upper electrode film 101A is formed during patterning of the first openings 108-1A, the second openings 108-2A and the another openings 104'. After the resist pattern 50 is removed by an ashing method, another resist pattern is formed on the upper electrode film 101A and the high dielectric layer 103. After irradiating the another resist pattern with ultraviolet, the high dielectric layer 103 and the lower electrode layer 102 are patterned using photolithography and etching methods using the another resist pattern, in order to form outlines of the high dielectric film 103A and the lower electrode film 102A as shown in FIG. 10D. At this time, the another opening 104 is also formed in the high dielectric film 103A. Also, the high dielectric film 103A is patterned so that an outside dimension of the high dielectric film 103A is larger than an outside dimension of the upper electrode film 101A, and the lower electrode film 102A is patterned so that an outside dimension of the lower electrode film 102A is larger than the outside dimension of the high dielectric film 103A. After the another resist pattern is removed by the ashing method, the upper electrode film 101A, the high dielectric film 103A and the lower electrode film 102A are treated with heat in the presence of oxygen at a temperature which is between 550 and 700 degrees centigrade, in order to make good the upper electrode film 101A, the high dielectric film 103A and the lower electrode film 102A damaged by the above-described etching processes. The upper electrode film 101A, the high dielectric film 103A and the lower electrode film 102A configure the thin-film capacitor 100A.

Figure 10E:
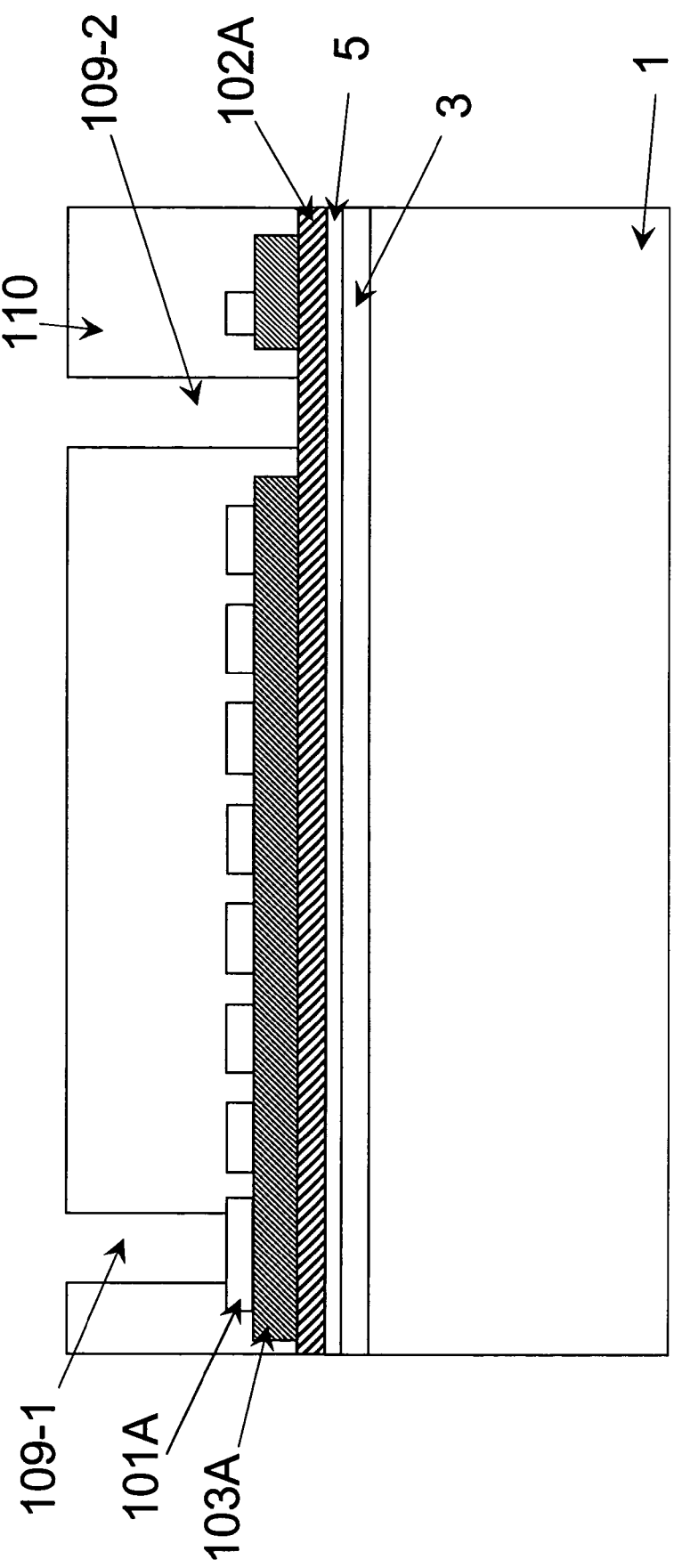
Figure 10F:
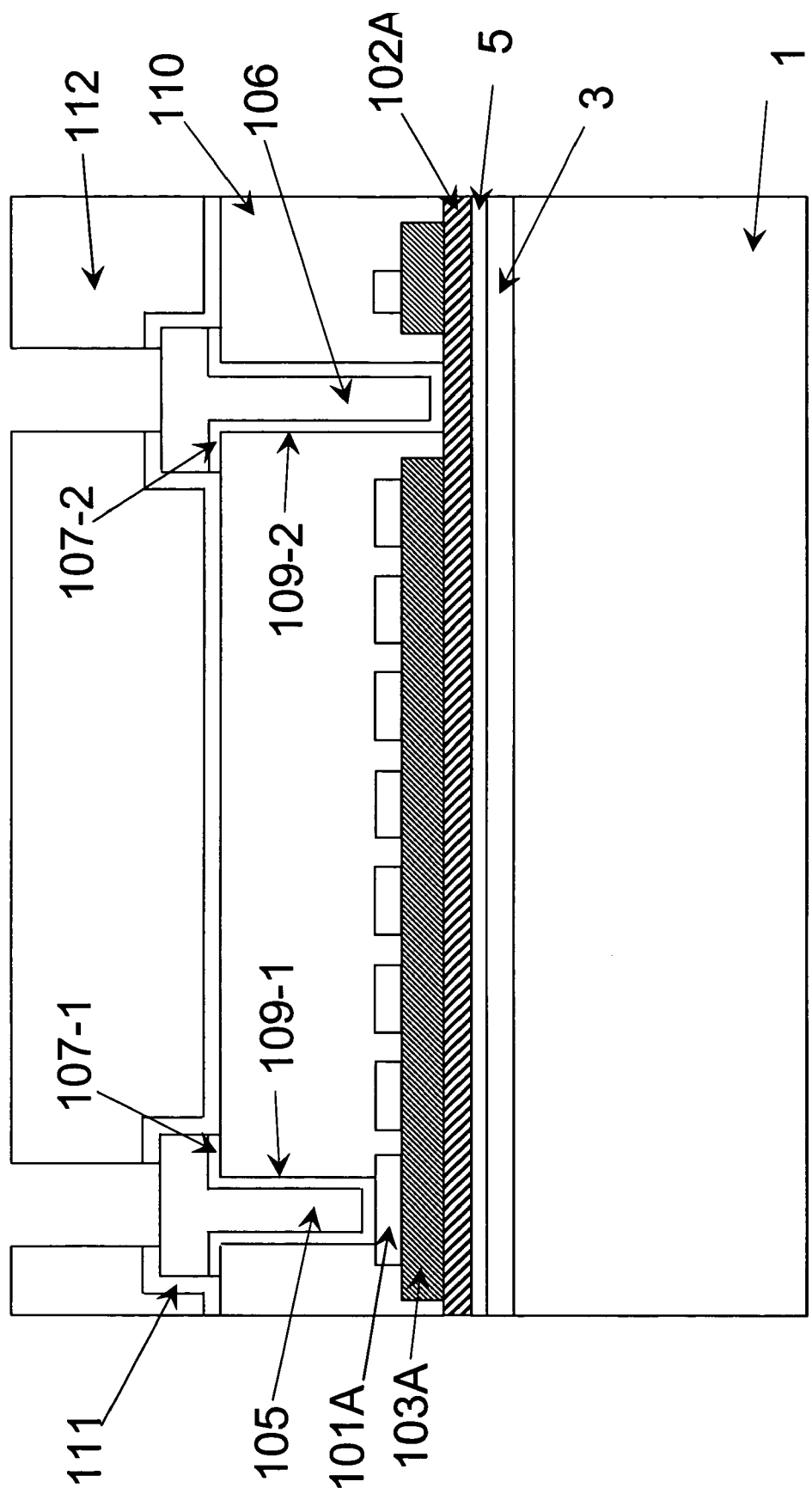

Next, as shown in FIG. 10E, the interlayer insulating film 110 is formed on the adhesive film 5 so as to cover the upper electrode film 101A, the high dielectric film 103A and the lower electrode film 102A. The first openings 108-1A and the second openings 108-2A are filled with the interlayer insulating film 110. Therefore, the adhesiveness between the interlayer insulating film 110 and the upper electrode film 101A may be improved. That is, the interlayer insulating film 110 may be suppressed from being separated away from the upper electrode film 101A. The interlayer insulating film 110 includes a plasma oxide film such as a TEOS film and is formed by a Chemical Vapor Deposition (CVD) method. A resist pattern is formed on the interlayer insulating film 110, and then the first contact hole 109-1 and the second contact hole 109-2 are formed in the interlayer insulating film 110 by photolithography and etching methods, using the resist pattern as a mask. Then, the interlayer insulating film 110 and the lower electrode film 102A are treated with heat in the presence of oxygen at a temperature which is between 500 and 700 degrees centigrade, in order to make good the interlayer insulating film 110 and the lower electrode film 102A damaged by the above-described etching processes.

Thereafter, as shown in FIG. 10F, the first barrier film 107-1 is formed on the interlayer insulating film 110 and in the first contact hole 109-1, and the second barrier film 107-2 is formed on the interlayer insulating film 110 and in the second contact hole 109-2. Furthermore, the first interconnection film 105 is formed on the first barrier film 107-1 and in the first contact hole 109-1 so as to be electrically coupled to the upper electrode film 101A, and the second interconnection film 106 is formed on the second barrier film 107-2 and in the second contact hole 109-2 so as to be electrically coupled to the lower electrode film 102A. In addition, the first barrier film 107-1 is not electrically coupled to the second barrier film 107-2. These first and second barrier films 107-1 and 107-2 and the first and second interconnection films 105 and 106 are formed by photolithography and etching methods. Each of the first and second barrier films 107-1 and 107-2 includes two titanium nitride films which are formed by a sputtering method. One of the two titanium nitride films has a thickness of 75 nm. Each of the first and second interconnection films 105 and 106 includes an aluminum film which is formed by a sputtering method and has a thickness of 500 nm. The first and second barrier films 107-1 and 107-2 may suppress the first and second interconnection films 105 and 106 from reacting chemically with the upper electrode film 101A and the lower electrode film 102A. After the first and second interconnection films 105 and 106 are formed, another adhesive film 111 is formed on the interlayer insulating film 110 and the first and second interconnection films 105 and 106, so that a portion of each of the first and second interconnection films 105 and 106 are exposed from the adhesive film 111. Then, a passivation film 112 is formed on the adhesive film so as to expose the portions of the first and second interconnection films 105 and 106. The exposed portions of first and second interconnection films 105 and 106 are used as terminals of the thin-film capacitor 100A. The adhesive film 111 is a tantalum oxide film which is formed by a reactive sputtering method. The passivation film 112 is a silicon nitride film which is formed by the CVD method. In this example, the passivation film 112 has a thickness of 850 nm. As described above, the thin-film capacitor 100A is manufactured.

According to the first preferred embodiment, the thin-film capacitor includes the first and second openings in one film of the lower electrode film, the high dielectric film and the upper electrode film. Therefore, adhesiveness between the thin-film capacitor and the interlayer insulating film or adhesiveness between the lower electrode film, the high dielectric film and the upper electrode film may be more improved. Also, the first opening extends from the first edge portion toward the second edge portion and the second opening extends from the second edge portion toward the first edge portion. That is, the one film of the lower electrode film and the upper electrode film is windingly configured. Therefore, the electrical current may flow smoothly in regions between the first opening and the second opening of the one film of the lower electrode film and the upper electrode film. As a result, the resistivities of the upper electrode film and the lower electrode film may be suppressed from increasing, and then the high-frequency property of the thin-film capacitor may be suppressed from deteriorating. Furthermore, since the first openings and the second openings are formed during patterning of the outline of the one film of the lower electrode film, the high dielectric film and the upper electrode film, the thin-film capacitor is manufactured without involved processes.

Also, in the above mentioned first preferred embodiment, an area of the contact opening may be different than an area of each of the first and second openings. On such an occasion as this, the area of each of the first and second openings may be designed without relation to the area of the contact opening. That is, the first and second openings may be formed to have narrow or broad width. Therefore, the number of the first and second openings may be controlled. As a result, the area of each of the first and second openings or the number of the first and second openings may be set in order to improve the adhesiveness between the thin-film capacitor and the interlayer insulating film, the adhesiveness between the lower electrode film, the high dielectric film and the upper electrode film, and in order to suppress the high-frequency property of the thin-film capacitor from deteriorating. Furthermore, the area of the contact opening may be flexibly set without relation to the area of the first and second openings, so that the second interconnection film is not electrically coupled to the upper electrode film. On the other hand, the area of the contact opening may be substantially equal to the area of each of the first and second openings. On such an occasion as this, any one of the first and second openings may be used as the contact opening, in order to realize the electrical connection between the second interconnection film and the lower electrode film. Therefore, the location of the electrical connection between the second interconnection film and the lower electrode film may be flexibly designed.

Figure 11:
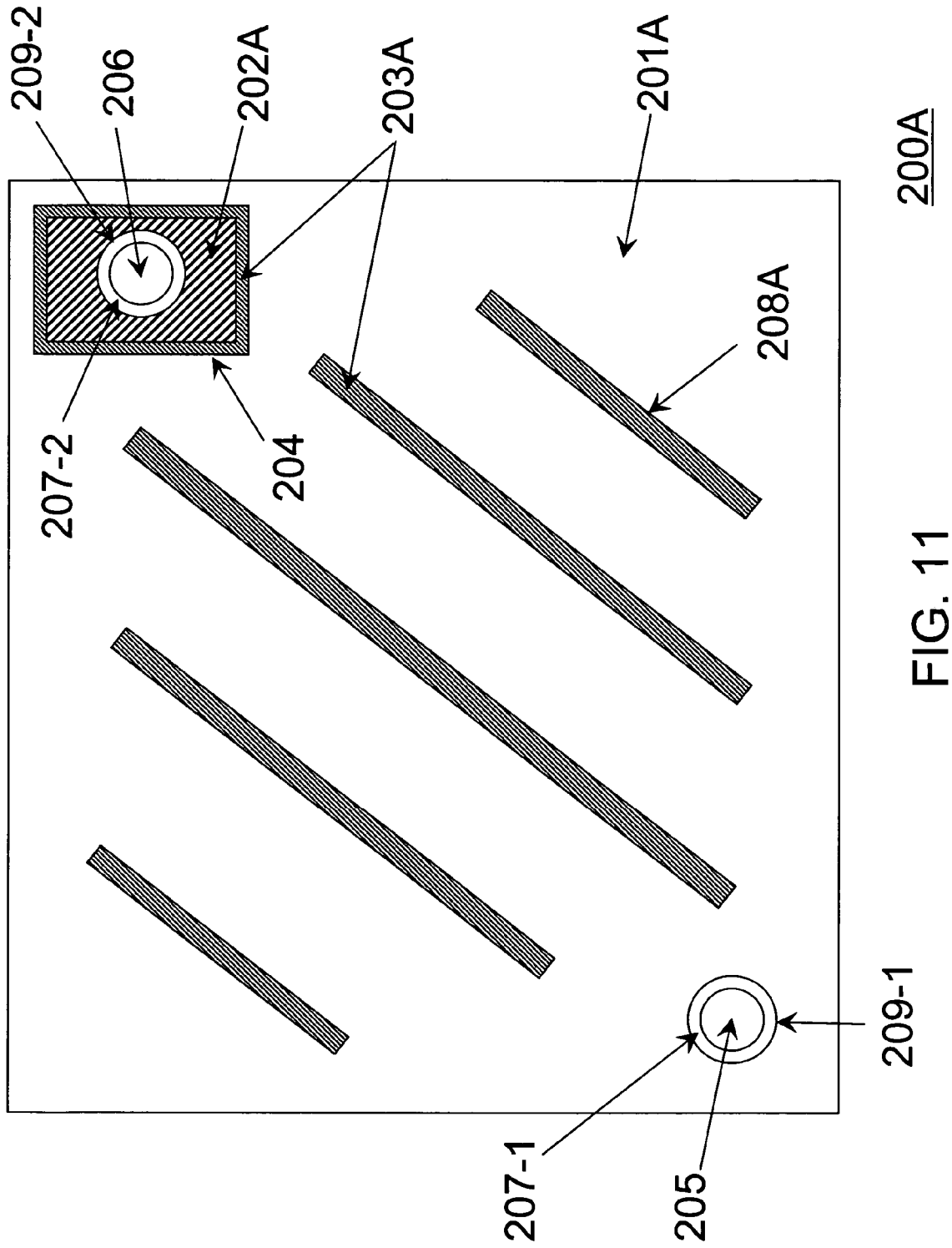
FIG. 11 is a schematic top view for describing a thin-film capacitor according to a second preferred embodiment of the present invention.

FIG. 11 is a schematic top view for describing a thin-film capacitor 200A according to a second preferred embodiment of the present invention. The thin-film capacitor 200A includes a lower electrode film 202A, a high dielectric film 203A and an upper electrode film 201A. These films 201A through 203A are disposed over the principal surface of a substrate (1) through an insulating film and an adhesive film (5), in the manner of films 101A through 103A according to the first preferred embodiment. That is, the lower electrode film 202A is disposed over the principal surface of a substrate (1) through an insulating film (3) and an adhesive film (5), the high dielectric film 203A is disposed on the lower electrode film 202A, and the upper electrode film 201A is disposed on the high dielectric film 203A. In this example, the upper electrode film 201A may be configured by four edge portions.

That is, the upper electrode film 201A may be rectangular. Also, an outside dimension of the high dielectric film 203A is larger than an outside dimension of the upper electrode film 201A, and an outside dimension of the lower electrode film 202A is larger than the outside dimension of the high dielectric film 203A.

As shown in FIG. 11, the upper electrode film 201A includes a plurality of openings 208A which may be slit-shaped. The openings 208A are terminated away from all of the four edge portions of the upper electrode film 201A. That is, each of the four edge portions of the upper electrode film 201A is not divided by the openings 208A. The openings 208A are arranged diagonally to one of the edge portions of the upper electrode film 201A and arranged in parallel with each other. Each of the terminated ends of the openings 208A may have a curved end portion instead of a squared end portion. Also, the openings 208A are formed during patterning of the outline of the upper electrode film 201A.

The upper electrode film 201A, the high dielectric film 203A and the lower electrode film 202A are covered by an interlayer insulating film (110), such as in the manner of the thin-film capacitor 100A according to the first preferred embodiment. The openings 208A of the upper electrode film 201A are filled with the interlayer insulating film (110). The interlayer insulating film (110) includes a first contact hole 209-1 and a second contact hole 209-2 therein. The first and second contact holes 209-1 and 209-2 are arranged diagonally with respect to each other on the upper electrode film 201A near corners of the upper electrode film 201A. The first contact hole 209-1 is filled with a first barrier film 207-1 and a first interconnection film 205. The first interconnection film 205 is electrically coupled to the upper electrode film 201A through the first barrier film 207-1. The second contact hole 209-2 is filled with a second barrier film 207-2 and a second interconnection film 206. The second interconnection film 206 is electrically coupled to the lower electrode film 202A through the second barrier film 207-2. Furthermore, the upper electrode film 201A and the high dielectric film 203A include a contact opening 204 which surrounds the second contact hole 209-2. The contact opening 204 is terminated in the upper electrode region 201A.

Since the thin-film capacitor 200A includes the openings 208A in the upper electrode film 201A, which are filled with the interlayer insulating film (110), adhesiveness between the upper electrode film 201A and the interlayer insulating film (110) may be more improved. Also, the openings 208A are terminated away from all of the four edge portions of the upper electrode film 201A. Therefore, the electrical current may flow smoothly in regions between the openings 208A of the upper electrode film 201A and in regions near the edge portions of the upper electrode film 201A. As a result, the resistivity of the upper electrode film 201A may be suppressed from increasing, and then the high-frequency property of the thin-film capacitor 200A may be suppressed from deteriorating. Furthermore, the first and second contact holes 209-1 and 209-2 are arranged diagonally with respect to each other on the upper electrode film 201A near corners of the upper electrode film 201A, and the openings 208A are arranged diagonally to one of the edge portions of the upper electrode film 201A. Therefore, an electrical path between the first interconnection film 205 and the second interconnection film 206 may be shortened. That is, the electrical resistivity between the first interconnection film 205 and the second interconnection film 206 may be decreased.

Figure 12:
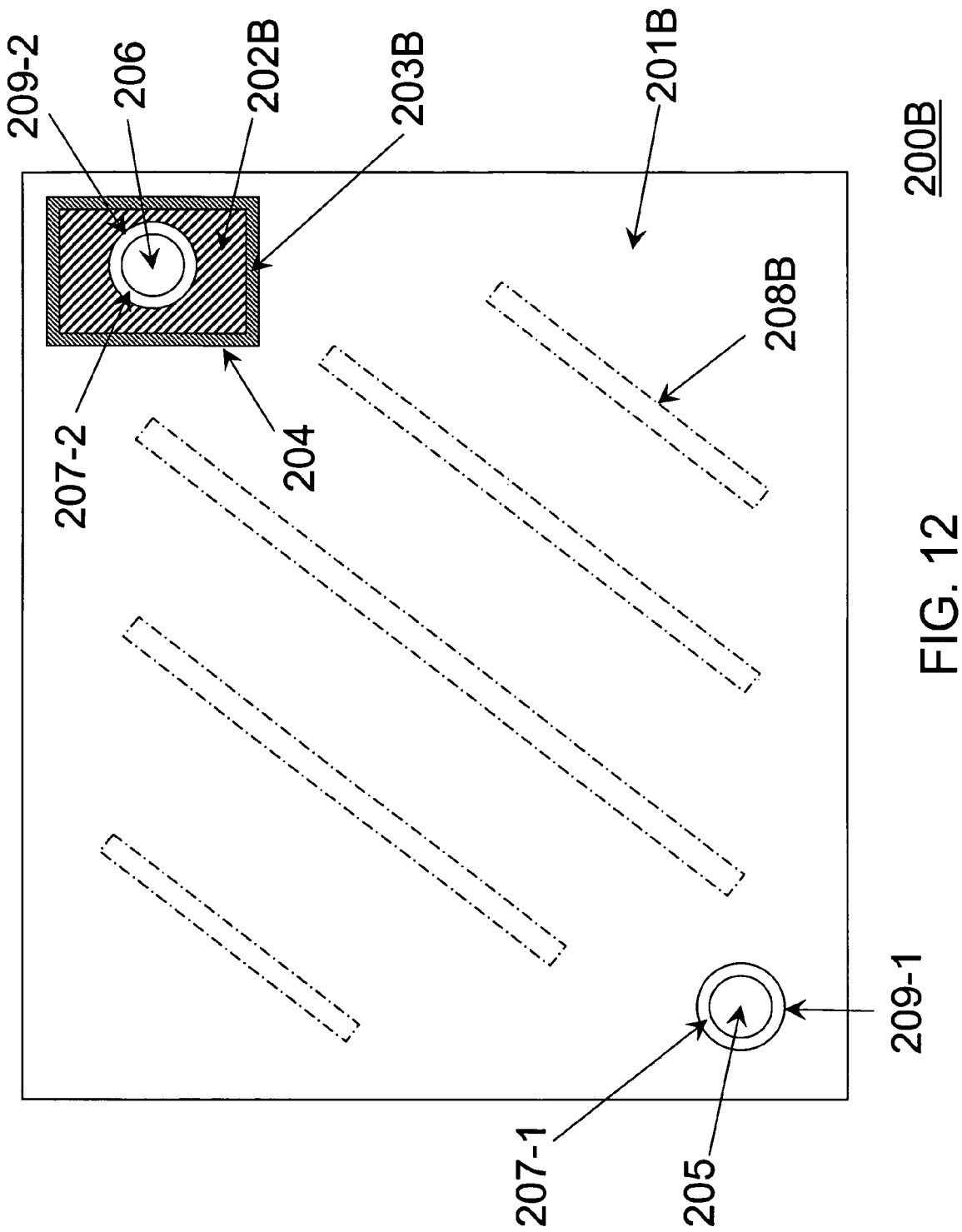
FIGS. 12 through 15 are schematic top views for describing the other thin-film capacitors according to the second preferred embodiment of the present invention.

FIG. 12 is a schematic top view for describing another thin-film capacitor 200B according to the second preferred embodiment of the present invention. The thin-film capacitor 200B includes a lower electrode film 202B, a high dielectric film 203B and an upper electrode film 201B different than those of the thin-film capacitor 200A. The other features of the thin-film capacitor 200B are similar to those of the thin-film capacitor 200A.

The lower electrode film 202B is disposed over the principal surface of a substrate (1) through an insulating film (3) and an adhesive film (5), such as described with respect to FIG. 2. The high dielectric film 203B is disposed on the lower electrode film 202B, and the upper electrode film 201B is disposed on the high dielectric film 203B. In this example, the high dielectric film 203B may be configured by four edge portions. That is, the high dielectric film 203B may be rectangular. Also, an outside dimension of the high dielectric film 203B is larger than an outside dimension of the upper electrode film 201B, and an outside dimension of the lower electrode film 202B is larger than the outside dimension of the high dielectric film 203B.

As shown in FIG. 12, the high dielectric film 203B includes a plurality of openings 208B which may be slit-shaped. The openings 208B are shown by alternate long and short dash lines in FIG. 12. The openings 208B of the high dielectric film 203B are filled with the upper electrode film 201B. The openings 208B are terminated away from all of the four edge portions of the high dielectric film 203B. That is, each of the four edge portions of the high dielectric film 203B is not divided by the openings 208B. The openings 208B are arranged diagonally to one of the edge portions of the high dielectric film 203B and arranged in parallel with each other. Each of the terminated ends of the openings 208B may have a curved end portion instead of a squared end portion. Also, the openings 208B are formed during patterning of the outline of the high dielectric film 203B. The upper electrode film 201B, the high dielectric film 203B and the lower electrode film 202B are covered by an interlayer insulating film (110), in the manner described with respect to the thin-film capacitor 200A.

Since the thin-film capacitor 200B includes the openings 208B in the high dielectric film 203B, which are filled with the upper electrode film 201B, adhesiveness between the upper electrode film 201B and the high dielectric film 203B may be more improved.

Figure 13:
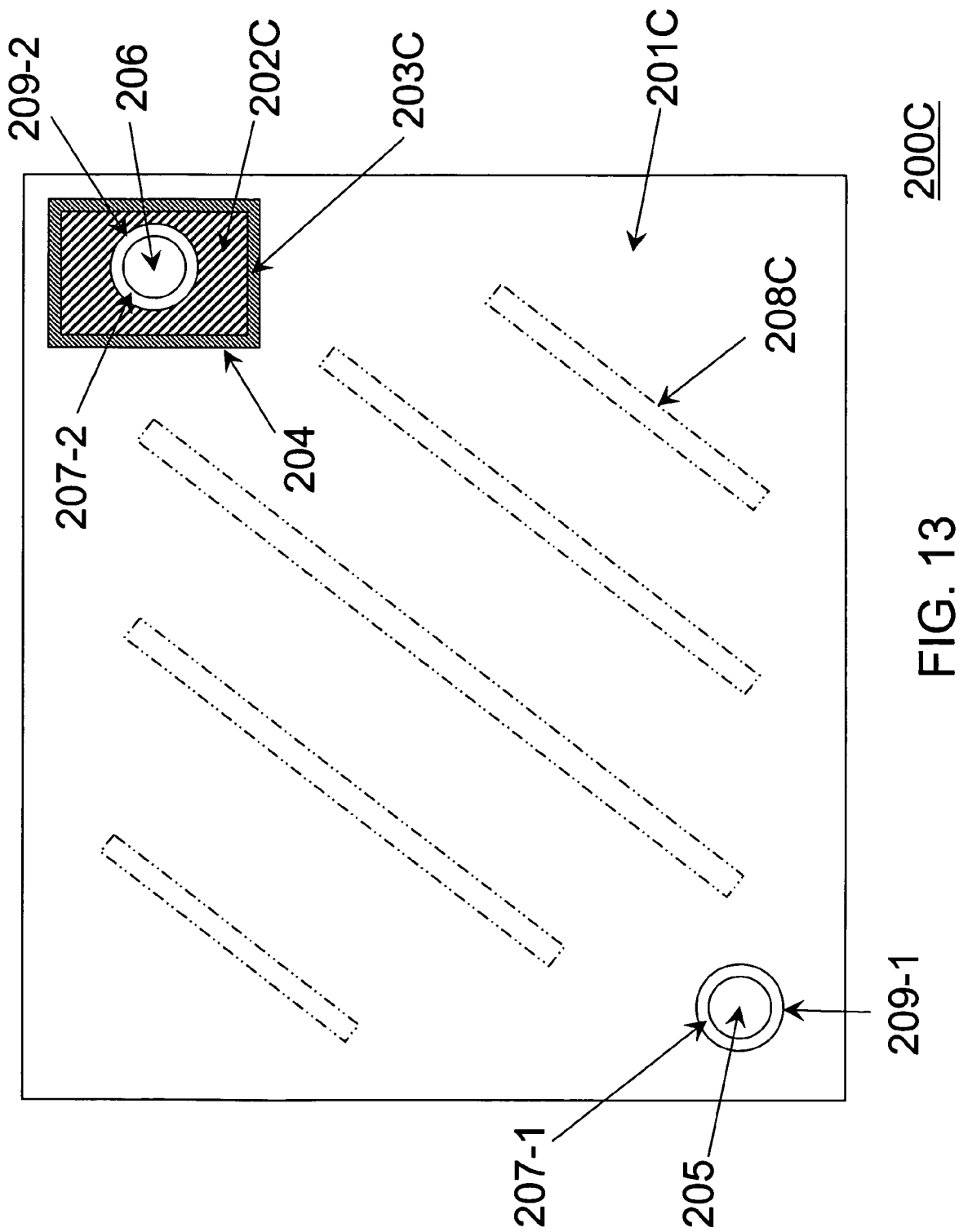

FIG. 13 is a schematic top view for describing another thin-film capacitor 200C according to the second preferred embodiment of the present invention. The thin-film capacitor 200C includes a lower electrode film 202C, a high dielectric film 203C and an upper electrode film 201C different than those of the thin-film capacitor 200A. The other features of the thin-film capacitor 200C are similar to those of the thin-film capacitor 200A.

The lower electrode film 202C is disposed over the principal surface of a substrate through an insulating film and an adhesive film, such as described with respect to FIG. 2. The high dielectric film 203C is disposed on the lower electrode film 202C, and the upper electrode film 201C is disposed on the high dielectric film 203C. In this example, the lower electrode film 202C may be configured by four edge portions. That is, the lower electrode film 202C may be rectangular. Also, an outside dimension of the high dielectric film 203C is larger than an outside dimension of the upper electrode film 201C, and an outside dimension of the lower electrode film 202C is larger than the outside dimension of the high dielectric film 203C.

As shown in FIG. 13, the lower electrode film 202C includes a plurality of openings 208C which may be slit-shaped. The openings 208C are shown by chain double-dashed lines in FIG. 13. The openings 208C of the lower electrode film 202C are filled with the high dielectric film 203C. The openings 208C are terminated away from all of the four edge portions of the lower electrode film 202C. That is, each of the four edge portions of the lower electrode film 202C is not divided by the openings 208C. The openings 208C are arranged diagonally to one of the edge portions of the lower electrode film 202C and arranged in parallel with each other. Each of the terminated ends of the openings 208C may have a curved end portion instead of a squared end portion. Also, the openings 208C are formed during patterning of the outline of the lower electrode film 202C. The upper electrode film 201C, the high dielectric film 203C and the lower electrode film 202C are covered by an interlayer insulating film (110), in the manner described with respect to the thin-film capacitor 200A.

Since the thin-film capacitor 200C includes the openings 208C in the lower electrode film 202C, which are filled with the high dielectric film 203C, adhesiveness between the lower electrode film 202C and the high dielectric film 203C may be more improved. Also, the openings 208C are terminated away from all of the four edge portions of the lower electrode film 202C. Therefore, the electrical current may flow smoothly in regions between the openings 208C of the lower electrode film 202C and in regions near the edge portions of the lower electrode film 202C. As a result, the resistivity of the lower electrode film 202C may be suppressed from increasing, and then the high-frequency property of the thin-film capacitor 200C may be suppressed from deteriorating. Furthermore, the first and second contact holes 209-1 and 209-2 are arranged diagonally with respect to each other on the lower electrode film 202C and near corners of the lower electrode film 202C, and the openings 208A are arranged diagonally to one of the edge portions of the lower electrode film 202C. Therefore, an electrical path between the first interconnection film 205 and the second interconnection film 206 may be shortened. That is, the electrical resistivity between the first interconnection film 205 and the second interconnection film 206 may be decreased.

Figure 14:
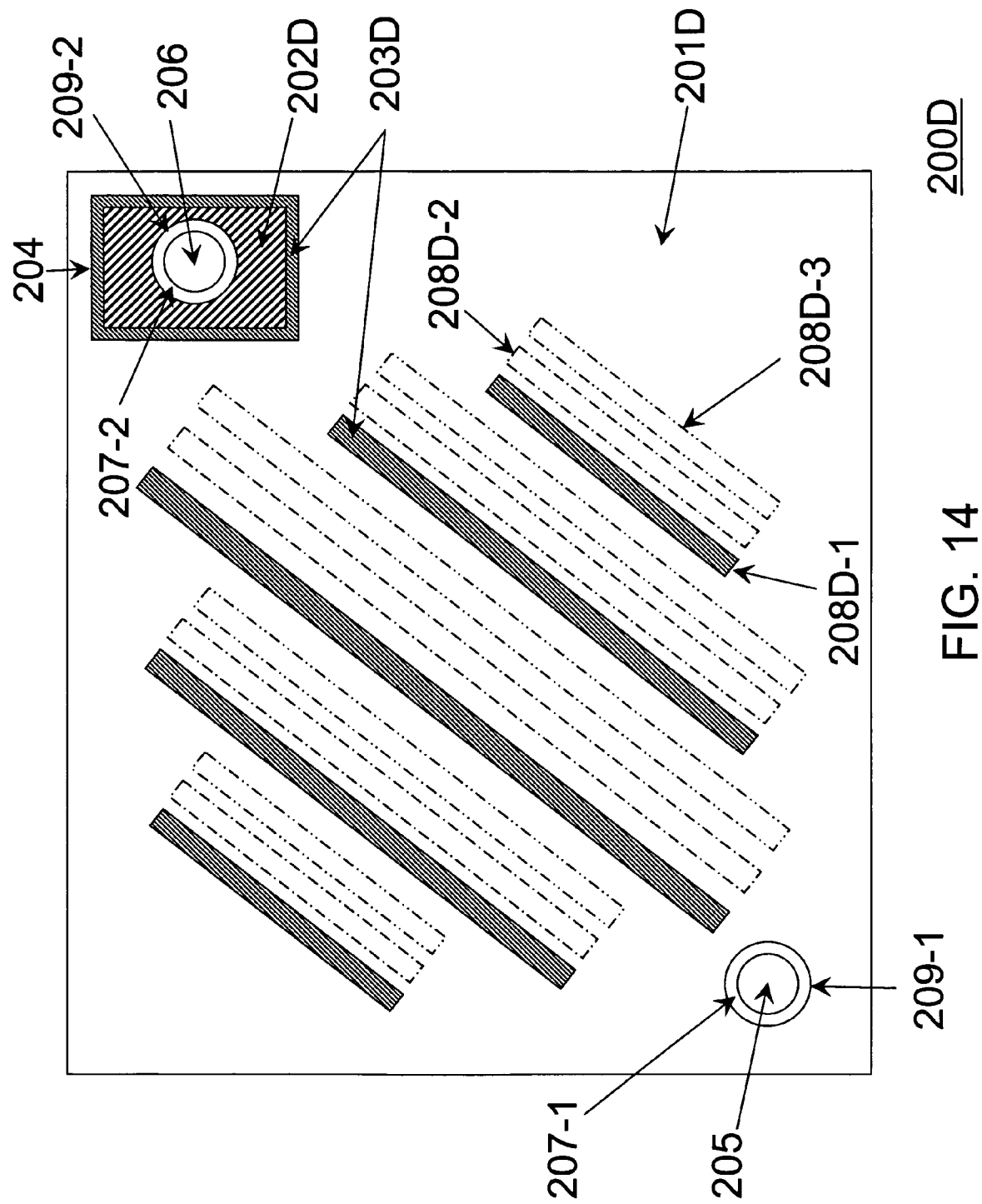

FIG. 14 is a schematic top view for describing another thin-film capacitor 200D according to the second preferred embodiment of the present invention. The thin-film capacitor 200D includes a lower electrode film 202D, a high dielectric film 203D and an upper electrode film 201D different than those of the thin-film capacitor 200A. The other features of the thin-film capacitor 200D are similar to those of the thin-film capacitor 200A.

The lower electrode film 202D is disposed over the principal surface of a substrate (1) through an insulating film (3) and an adhesive film (5), such as described with respect to FIG. 2. The high dielectric film 203D is disposed on the lower electrode film 202D, and the upper electrode film 201D is disposed on the high dielectric film 203D. In this example, each of the lower electrode film 202D, the high dielectric film 203D and the upper electrode film 201D may be configured by four edge portions. That is, each of them may be rectangular. Also, an outside dimension of the high dielectric film 203D is larger than an outside dimension of the upper electrode film 201D, and an outside dimension of the lower electrode film 202D is larger than the outside dimension of the high dielectric film 203D.

As shown in FIG. 14, the upper electrode film 201D includes a plurality of first openings 208D-1, the high dielectric film 203D includes a plurality of second openings 208D-2 shown by alternative long and short dash lines, and the lower electrode film 202D includes a plurality of third openings 208D-3 shown by chain double-dashed lines. These openings 208D-1 through 208D-3 may be slit-shaped. The openings 208D-1 through 208D-3 are not vertically aligned with each other. The first openings 208D-1 are filled with an interlayer insulating film (110) such as described with respect to FIG. 2. The first openings 208D-1 are terminated away from all of the four edge portions of the upper electrode film 201D. That is, each of the four edge portions of the upper electrode film 201D is not divided by the first openings 208D-1. The first openings 208D-1 are arranged diagonally to one of the edge portions of the upper electrode film 201D and arranged in parallel with each other. Each of the terminated ends of the first openings 208D-1 may have a curved end portion instead of a squared end portion. Also, the first openings 208D-1 are formed during patterning of the outline of the upper electrode film 201D. The second openings 208D-2 are filled with the upper electrode film 201D. The second openings 208D-2 are terminated away from all of the four edge portions of the high dielectric film 203D. That is, each of the four edge portions of the high dielectric film 203D is not divided by the second openings 208D-2. The second openings 208D-2 are arranged diagonally to one of the edge portions of the high dielectric film 203D and arranged in parallel with each other. Each of the terminated ends of the second openings 208D-2 may have a curved end portion instead of a squared end portion. Also, the second openings 208D-2 are formed during patterning of the outline of the high dielectric film 203D. The third openings 208D-3 are filled with the high dielectric film 203D. The third openings 208D-3 are terminated away from all of the four edge portions of the lower electrode film 202D. That is, each of the four edge portions of the lower electrode film 202D is not divided by the third openings 208D-3. The third openings 208D-3 are arranged diagonally to one of the edge portions of the lower electrode film 202D and arranged in parallel with each other. Each of the terminated ends of the third openings 208D-3 may have a curved end portion instead of a squared end portion. Also, the third openings 208D-3 are formed during patterning of the outline of the lower electrode film 202D. The upper electrode film 201D, the high dielectric film 203D and the lower electrode film 202D are covered by the interlayer insulating film (110) in the manner as described with respect to the thin-film capacitor 200A.

As described above, the thin-film capacitor 200D includes the first openings 208D-1 in the upper electrode film 201D, the second openings 208D-2 in the high dielectric film 203D and the third openings 208D-3 in the lower electrode film 202D. Moreover, the first openings 208D-1 are filled with the interlayer insulating film (110), the second openings 208D-2 are filled with the upper electrode film 201D, and the third openings 208D-3 are filled with the high dielectric film 203C. Therefore, each adhesiveness among the lower electrode film 202D, the high dielectric film 203D, the upper electrode film 201D and the interlayer insulating film (110) may be more improved.

Also, the first openings 208D-1 are terminated away from all of the four edge portions of the upper electrode film 201D. Therefore, the electrical current may flow smoothly in regions between the first openings 208D-1 of the upper electrode film 201D and in regions near the edge portions of the upper electrode film 201D. The third openings 208D-3 are terminated away from all of the four edge portions of the lower electrode film 202D. Therefore, the electrical current may flow smoothly in regions between the third openings 208D-3 of the lower electrode film 202D and in regions near the edge portions of the lower electrode film 202D. As a result, each resistivity of the upper electrode film 201D and the lower electrode film 202D may be suppressed from increasing, and then the high-frequency property of the thin-film capacitor 200D may be suppressed from deteriorating.

Figure 15:
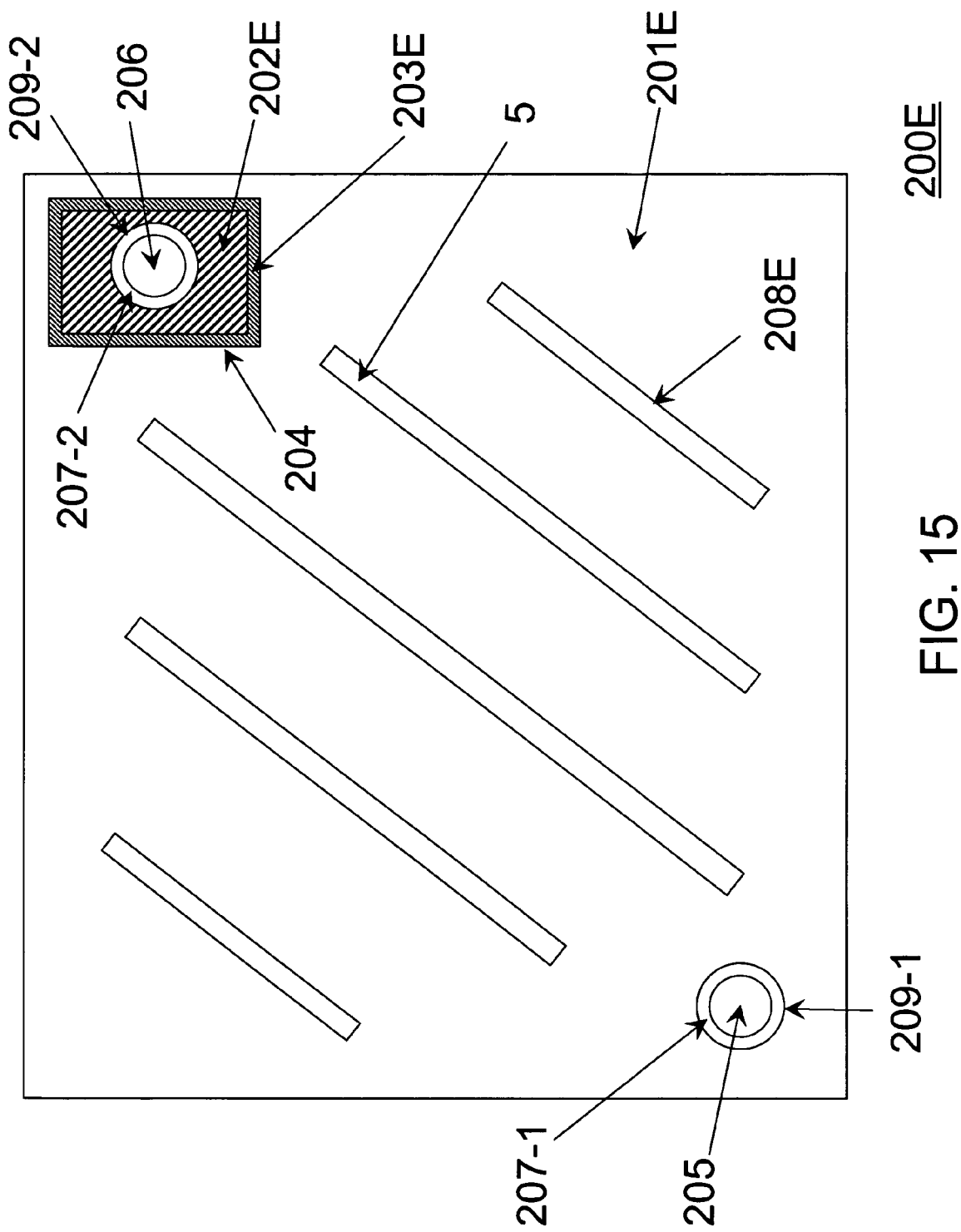

FIG. 15 is a schematic top view for describing another thin-film capacitor 200E according to the second preferred embodiment of the present invention. The thin-film capacitor 200E includes a lower electrode film 202E, a high dielectric film 203E and an upper electrode film 201E different than those of the thin-film capacitor 200A. The other features of the thin-film capacitor 200E are similar to those of the thin-film capacitor 200A.

The lower electrode film 202E is disposed over the principal surface of a substrate (1) through an insulating film (3) and an adhesive film (5), such as described with respect to FIG. 2. The high dielectric film 203E is disposed on the lower electrode film 202E, and the upper electrode film 201E is disposed on the high dielectric film 203E. In this example, each of the lower electrode film 202E, the high dielectric film 203E and the upper electrode film 201E may be configured by four edge portions. That is, each of them may be rectangular. Also, an outside dimension of the high dielectric film 203E is larger than an outside dimension of the upper electrode film 201E, and an outside dimension of the lower electrode film 202E is larger than the outside dimension of the high dielectric film 203E.

As shown in FIG. 15, a plurality of openings 208E penetrate through the upper electrode film 201E, the high dielectric film 203E and the lower electrode film 202E. The openings 208E may be slit-shaped and be arranged in parallel with each other. The adhesive film (5) is exposed from the openings 208E, and the openings 208E are filled with the interlayer insulating film (110). That is, the interlayer insulating film (110) contacts the adhesive film (5) through the openings 208E. The openings 208E are terminated away from all of the four edge portions of the upper electrode film 201E, the high dielectric film 203E and the lower electrode film 202E. That is, each of the four edge portions of the upper electrode film 201E, the high dielectric film 203E and the lower electrode film 202E is not divided by the openings 208E. The openings 208E are arranged diagonally to one of the edge portions of the upper electrode film 201E, the high dielectric film 203E and the lower electrode film 202E. The upper electrode film 201E, the high dielectric film 203E and the lower electrode film 202E are covered by the interlayer insulating film (110), in the manner as described with respect to the thin-film capacitor 200A.

Since the thin-film capacitor 200E includes the openings 208E which penetrate through the upper electrode film 201E, the high dielectric film 203E and the lower electrode film 202E and which are filled with the interlayer insulating film (110), each adhesiveness among the lower electrode film 202E, the high dielectric film 203E, the upper electrode film 201E and the interlayer insulating film (110) may be more improved.

Also, the openings 208E are terminated away from all of the four edge portions of the upper electrode film 201E. Therefore, the electrical current may flow smoothly in regions between the openings 208E of the upper electrode film 201E and in regions near the edge portions of the upper electrode film 201E. Furthermore, the openings 208E are terminated away from all of the four edge portions of the lower electrode film 202E. Therefore, the electrical current may flow smoothly in regions between the openings 208E of the lower electrode film 202E and in regions near the edge portions of the lower electrode film 202E. As a result, each resistivity of the upper electrode film 201E and the lower electrode film 202E may be suppressed from increasing, and then the high-frequency property of the thin-film capacitor 200E may be suppressed from deteriorating.

According to the second preferred embodiment, the thin-film capacitor includes the openings in one film of the lower electrode film, the high dielectric film and the upper electrode film. Therefore, adhesiveness between the thin-film capacitor and the interlayer insulating film or adhesiveness between the lower electrode film, the high dielectric film and the upper electrode film may be more improved. Also, the openings are terminated away from the edge portions which configure an outline of one film of the lower electrode film, the high dielectric film and the upper electrode film. Therefore, the electrical current may flow smoothly in regions between the openings of the one film and in regions near the edge portions of the one film. As a result, the resistivities of the upper electrode film and the lower electrode film may be suppressed from increasing, and then the high-frequency property of the thin-film capacitor may be suppressed from deteriorating. Furthermore, since the first openings are formed during patterning of the outline of the one film of the lower electrode film, the high dielectric film and the upper electrode film, the thin-film capacitor is manufactured without involved processes.

Also, in the above mentioned second preferred embodiment, an area of the contact opening may be different than an area of each of the openings. On such an occasion as this, the area of each of the openings may be designed without relation to the area of the contact opening. That is, the openings may be formed to have narrow or broad width. Therefore, the number of the openings may be controlled. As a result, the area of each of the openings or the number of the openings may be set in order to improve the adhesiveness between the thin-film capacitor and the interlayer insulating film, the adhesiveness between the lower electrode film, the high dielectric film and the upper electrode film, and in order to suppress the high-frequency property of the thin-film capacitor from deteriorating. Furthermore, the area of the contact opening may be flexibly set without relation to the area of the openings, so that the second interconnection film is not electrically coupled to the upper electrode film. On the other hand, the area of the contact opening may be substantially equal to the area of each of the openings. On such an occasion as this, any one of the openings may be used as the contact opening, in order to realize the electrical connection between the second interconnection film and the lower electrode film. Therefore, the location of the electrical connection between the second interconnection film and the lower electrode film may be flexibly designed.

Figure 16:
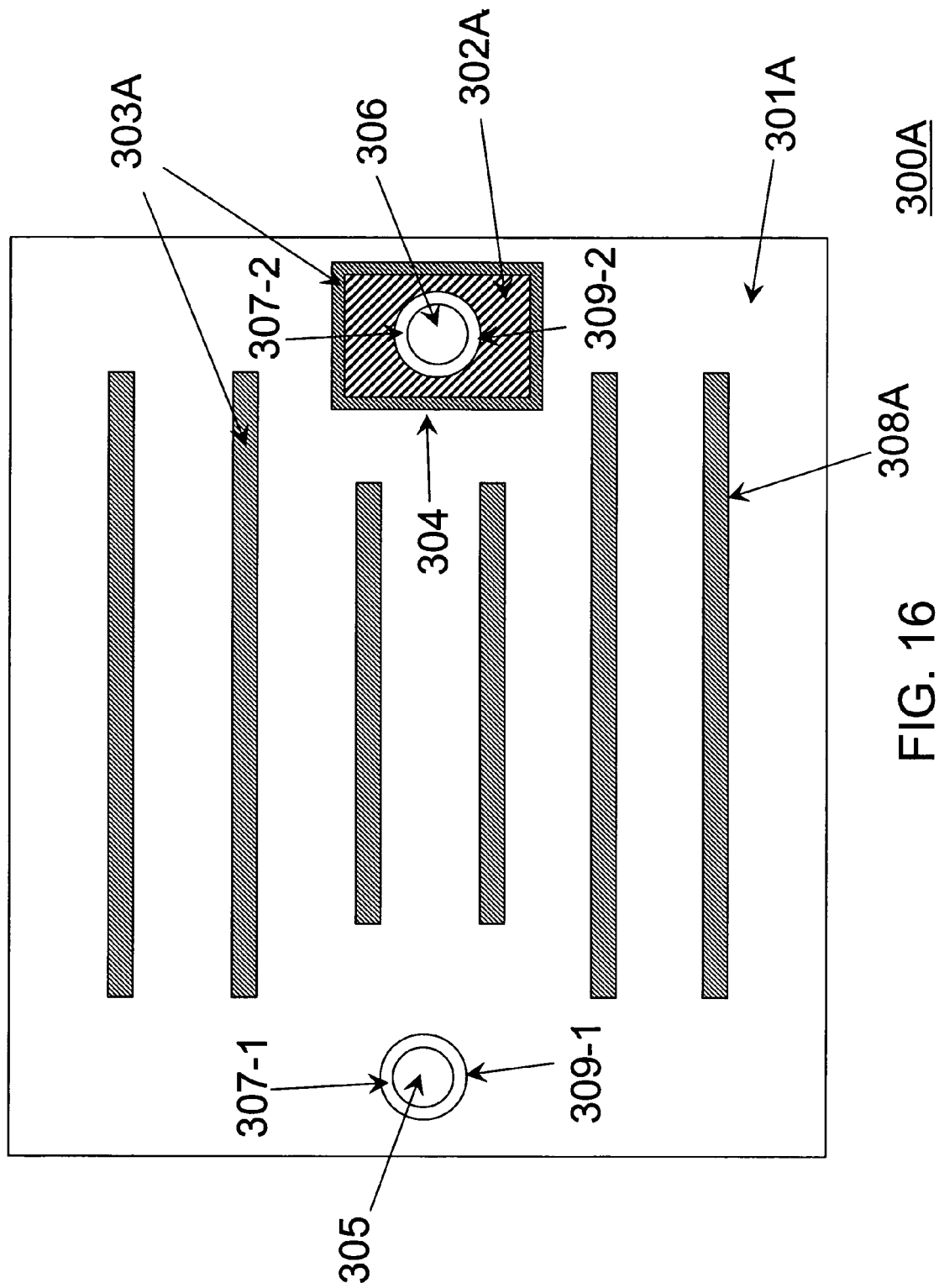
FIG. 16 is a schematic top view for describing a thin-film capacitor according to a third preferred embodiment of the present invention.

FIG. 16 is a schematic top view for describing a thin-film capacitor 300A according to a third preferred embodiment of the present invention. The thin-film capacitor 300A includes a lower electrode film 302A, a high dielectric film 303A and an upper electrode film 301A.

These films 301A through 303A are disposed over the principal surface of a substrate (1) through an insulating film (3) and an adhesive film (5), in the manner of the films 101A through 103A according to the first preferred embodiment. That is, the lower electrode film 302A is disposed over the principal surface of a substrate (1) through an insulating film (3) and an adhesive film (5), the high dielectric film 303A is disposed on the lower electrode film 302A, and the upper electrode film 301A is disposed on the high dielectric film 303A. In this example, the upper electrode film 301A may be configured by four edge portions. That is, the upper electrode film 301A may be rectangular. Also, an outside dimension of the high dielectric film 303A is larger than an outside dimension of the upper electrode film 301A, and an outside dimension of the lower electrode film 302A is larger than the outside dimension of the high dielectric film 303A.

As shown in FIG. 16, the upper electrode film 301A includes a plurality of openings 308A which may be slit-shaped. The openings 308A are terminated away from all of the four edge portions of the upper electrode film 301A. That is, each of the four edge portions of the upper electrode film 301A is not divided by the openings 308A. The openings 308A are arranged perpendicular to one of the edge portions of the upper electrode film 301A and arranged in parallel with each other. Each of the terminated ends of the openings 308A may have a curved end portion instead of a squared end portion. Also, the openings 308A are formed during patterning of the outline of the upper electrode film 301A.

The upper electrode film 301A, the high dielectric film 303A and the lower electrode film 302A are covered by an interlayer insulating film (110), in the manner as described with respect to the thin-film capacitor 100A according to the first preferred embodiment. The openings 308A of the upper electrode film 301A are filled with the interlayer insulating film (110). The interlayer insulating film (110) includes a first contact hole 309-1 and a second contact hole 309-2 therein. The first and second contact holes 309-1 and 309-2 are arranged near the terminated ends of the openings 308A. The first contact hole 309-1 is filled with a first barrier film 307-1 and a first interconnection film 305. The first interconnection film 305 is electrically coupled to the upper electrode film 301A through the first barrier film 307-1. The second contact hole 309-2 is filled with a second barrier film 307-2 and a second interconnection film 306. The second interconnection film 306 is electrically coupled to the lower electrode film 302A through the second barrier film 307-2. Furthermore, the upper electrode film 301A and the high dielectric film 303A include a contact opening 304 which surrounds the second contact hole 309-2. The contact opening 304 is terminated in the upper electrode region 301A.

Since the thin-film capacitor 300A includes the openings 308A in the upper electrode film 301A, which are filled with the interlayer insulating film (110), adhesiveness between the upper electrode film 301A and the interlayer insulating film (110) may be more improved. Also, the openings 308A are terminated away from all of the four edge portions of the upper electrode film 301A. Therefore, the electrical current may flow smoothly in regions between the openings 308A of the upper electrode film 301A and in regions near the edge portions of the upper electrode film 301A. As a result, the resistivity of the upper electrode film 301A may be suppressed from increasing, and then the high-frequency property of the thin-film capacitor 300A may be suppressed from deteriorating. Furthermore, since the first and second contact holes 309-1 and 309-2 are arranged near the terminated ends of the openings 308A, an electrical path between the first interconnection film 305 and the second interconnection film 306 may be shortened. That is, the electrical resistivity between the first interconnection film 305 and the second interconnection film 306 may be decreased.

Figure 17:
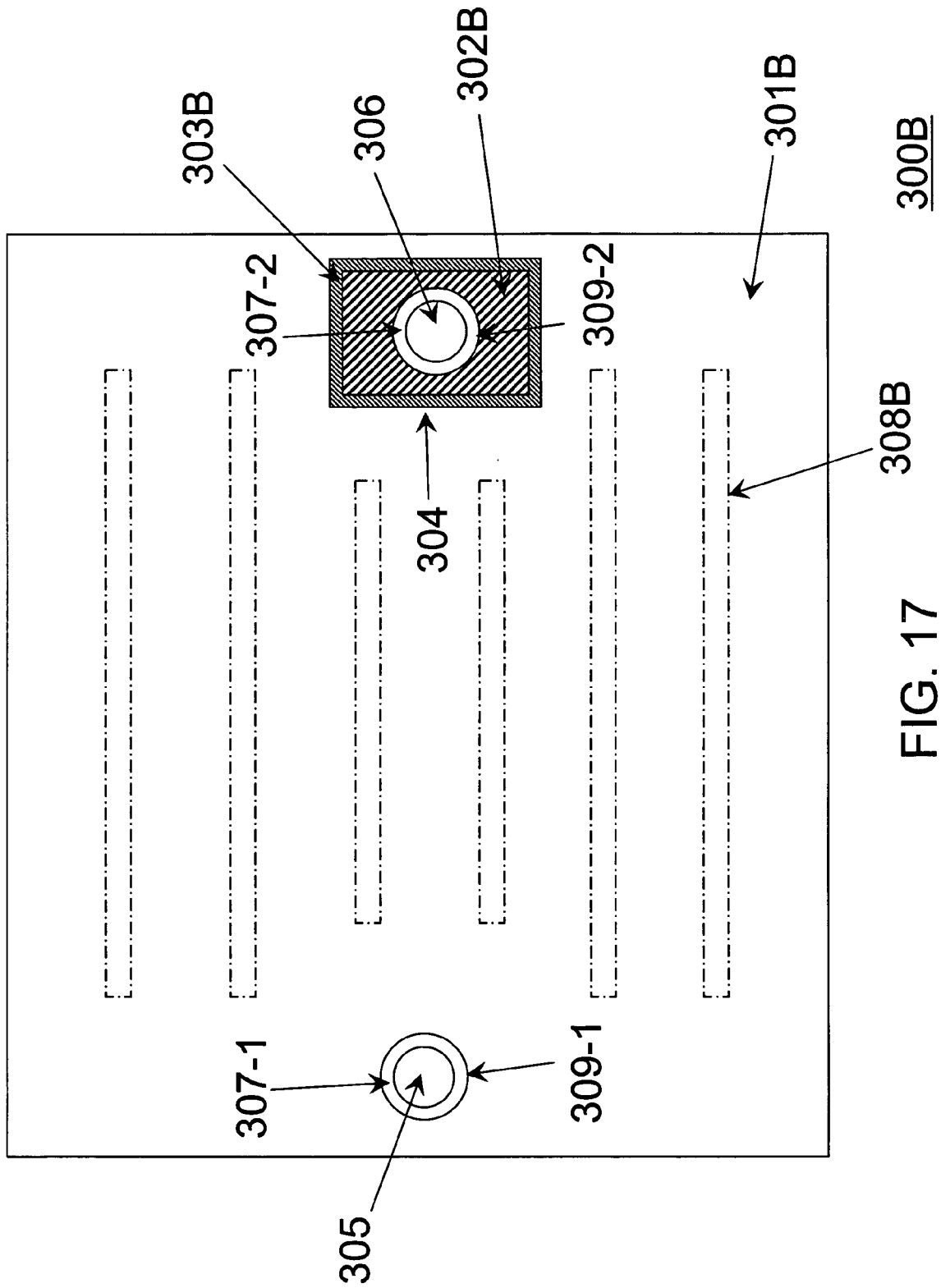
FIGS. 17 through 20 are schematic top views for describing the other thin-film capacitors according to the third preferred embodiment of the present invention.

FIG. 17 is a schematic top view for describing another thin-film capacitor 300B according to the third preferred embodiment of the present invention. The thin-film capacitor 300B includes a lower electrode film 302B, a high dielectric film 303B and an upper electrode film 301B different than those of the thin-film capacitor 300A. The other features of the thin-film capacitor 300B are similar to those of the thin-film capacitor 300A.

The lower electrode film 302B is disposed over the principal surface of a substrate (1) through an insulating film (3) and an adhesive film (5), such as described with respect to FIG. 2. The high dielectric film 303B is disposed on the lower electrode film 302B, and the upper electrode film 301B is disposed on the high dielectric film 303B. In this example, the high dielectric film 303B may be configured by four edge portions. That is, the high dielectric film 303B may be rectangular. Also, an outside dimension of the high dielectric film 303B is larger than an outside dimension of the upper electrode film 301B, and an outside dimension of the lower electrode film 302B is larger than the outside dimension of the high dielectric film 303B.

As shown in FIG. 17, the high dielectric film 303B includes a plurality of openings 308B which may be slit-shaped. The openings 308B are shown by alternate long and short dash lines in FIG. 17. The openings 308B of the high dielectric film 303B are filled with the upper electrode film 301B. The openings 308B are terminated away from all of the four edge portions of the high dielectric film 303B. That is, each of the four edge portions of the high dielectric film 303B is not divided by the openings 208B. The openings 208B are arranged perpendicular to one of the edge portions of the high dielectric film 303B and arranged in parallel with each other. Each of the terminated ends of the openings 308B may have a curved end portion instead of a squared end portion. Also, the openings 308B are formed during patterning of the outline of the high dielectric film 303B. The upper electrode film 301B, the high dielectric film 303B and the lower electrode film 302B are covered by an interlayer insulating film (110), in the manner as described with respect to the thin-film capacitor 300A.

Since the thin-film capacitor 300B includes the openings 308B in the high dielectric film 303B, which are filled with the upper electrode film 301B, adhesiveness between the upper electrode film 301B and the high dielectric film 303B may be more improved.

Figure 18:
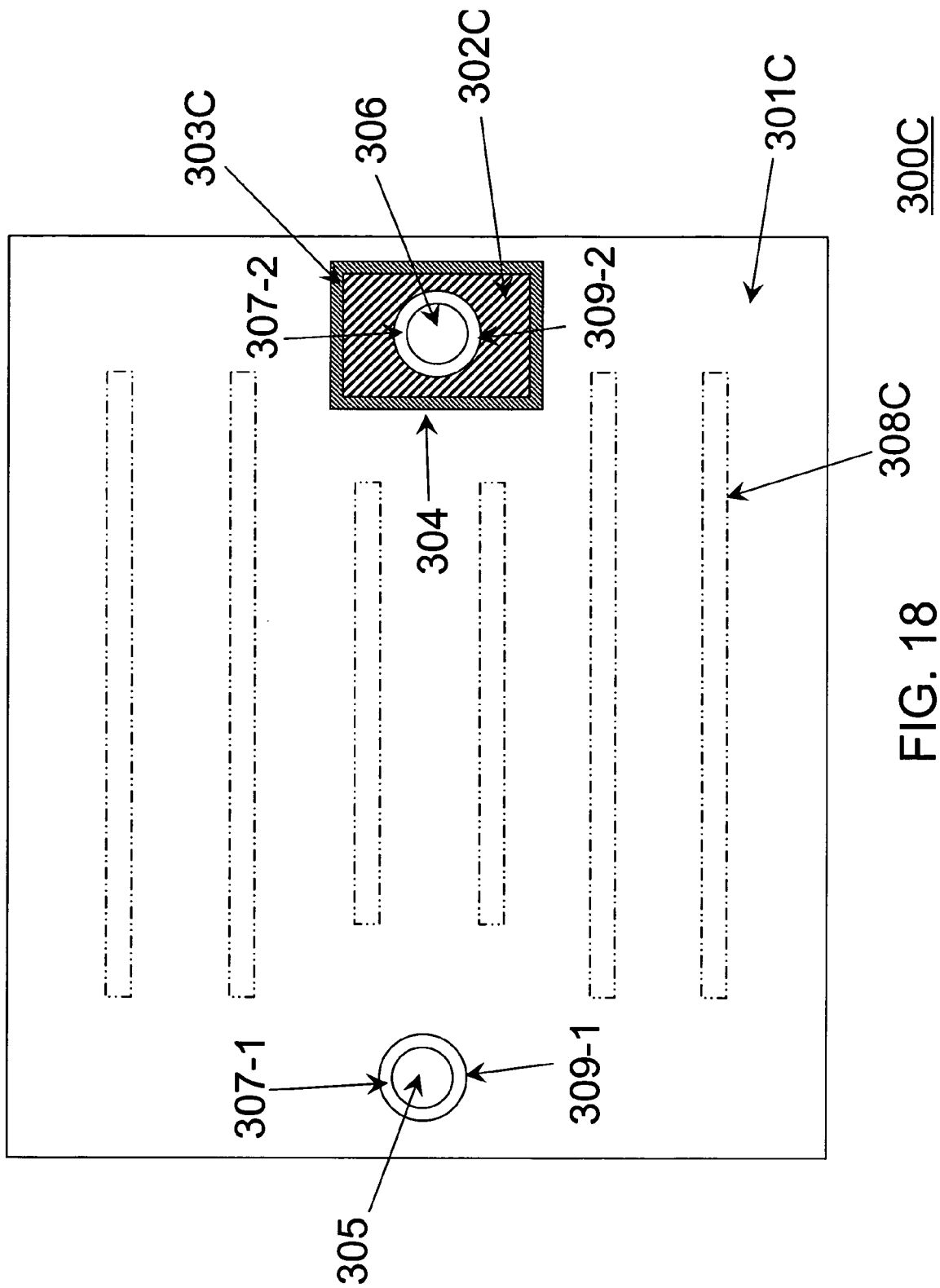

FIG. 18 is a schematic top view for describing another thin-film capacitor 300C according to the third preferred embodiment of the present invention. The thin-film capacitor 300C includes a lower electrode film 302C, a high dielectric film 303C and an upper electrode film 301C different than those of the thin-film capacitor 300A. The other features of the thin-film capacitor 300C are similar to those of the thin-film capacitor 200A.

The lower electrode film 302C is disposed over the principal surface of a substrate (1) through an insulating film (3) and an adhesive film (5), such as described with respect to FIG. 2. The high dielectric film 303C is disposed on the lower electrode film 302C, and the upper electrode film 301C is disposed on the high dielectric film 303C. In this example, the lower electrode film 302C may be configured by four edge portions. That is, the lower electrode film 302C may be rectangular. Also, an outside dimension of the high dielectric film 303C is larger than an outside dimension of the upper electrode film 301C, and an outside dimension of the lower electrode film 302C is larger than the outside dimension of the high dielectric film 303C.

As shown in FIG. 18, the lower electrode film 302C includes a plurality of openings 308C which may be slit-shaped. The openings 308C are shown by chain double-dashed lines in FIG. 18. The openings 308C of the lower electrode film 302C are filled with the high dielectric film 303C. The openings 308C are terminated away from all of the four edge portions of the lower electrode film 302C. That is, each of the four edge portions of the lower electrode film 302C is not divided by the openings 308C. The openings 308C are arranged perpendicular to one of the edge portions of the lower electrode film 302C and arranged in parallel with each other. Each of the terminated ends of the openings 308C may have a curved end portion instead of a squared end portion. Also, the openings 308C are formed during patterning of the outline of the lower electrode film 302C. The upper electrode film 301C, the high dielectric film 303C and the lower electrode film 302C are covered by the interlayer insulating film (110), in the manner as described with respect to the thin-film capacitor 300A.

Since the thin-film capacitor 300C includes the openings 308C in the lower electrode film 302C, which are filled with the high dielectric film 303C, adhesiveness between the lower electrode film 302C and the high dielectric film 303C may be more improved. Also, the openings 308C are terminated away from all of the four edge portions of the lower electrode film 302C. Therefore, the electrical current may flow smoothly in regions between the openings 308C of the lower electrode film 302C and in regions near the edge portions of the lower electrode film 302C. As a result, the resistivity of the lower electrode film 302C may be suppressed from increasing, and then the high-frequency property of the thin-film capacitor 300C may be suppressed from deteriorating. Furthermore, since the first and second contact holes 309-1 and 309-2 are arranged near the terminated ends of the openings 308A, an electrical path between the first interconnection film 305 and the second interconnection film 306 may be shortened. That is, the electrical resistivity between the first interconnection film 305 and the second interconnection film 306 may be decreased.

Figure 19:
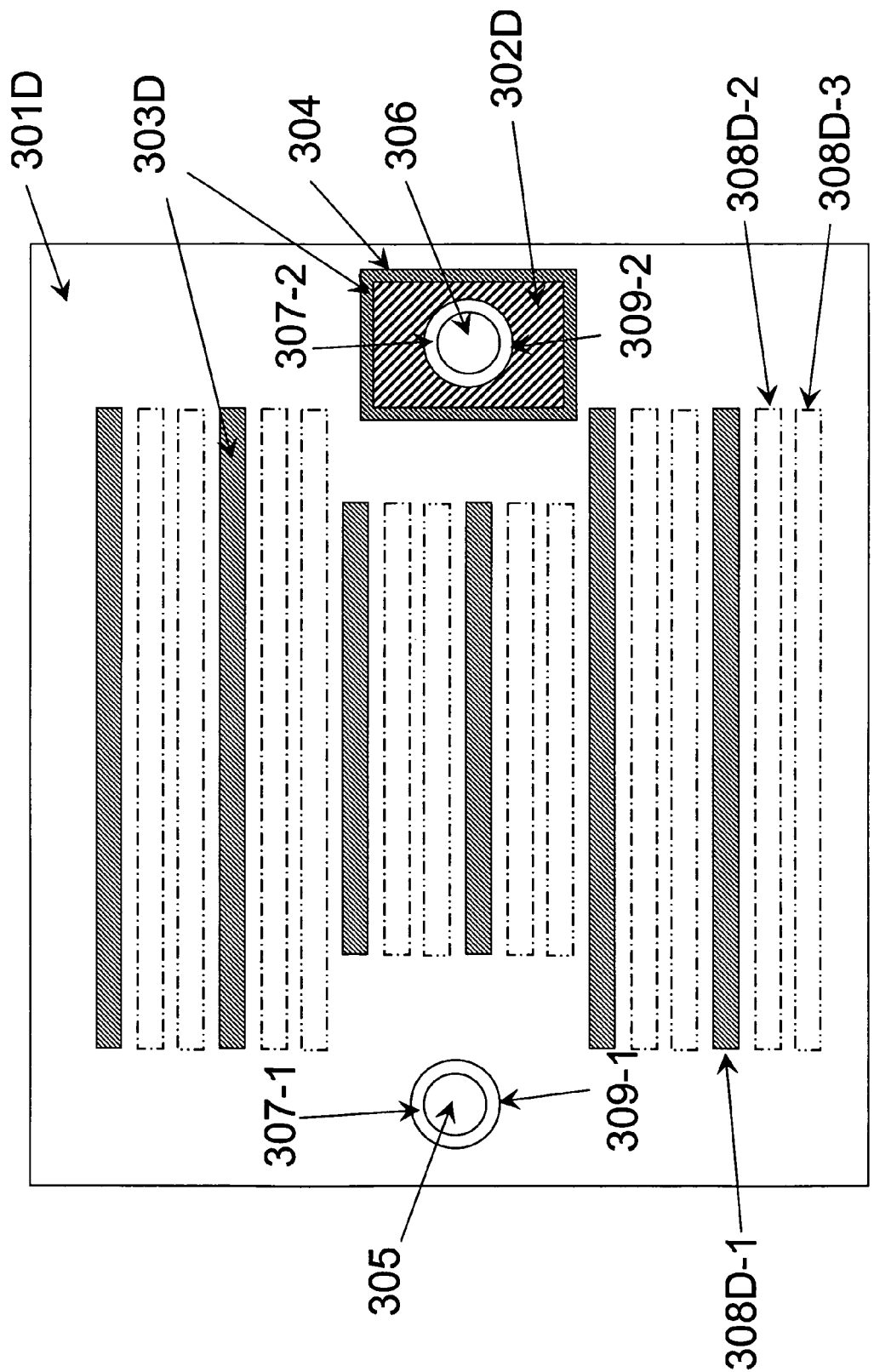

FIG. 19 is a schematic top view for describing another thin-film capacitor 300D according to the third preferred embodiment of the present invention. The thin-film capacitor 300D includes a lower electrode film 302D, a high dielectric film 303D and an upper electrode film 301D different than those of the thin-film capacitor 300A. The other features of the thin-film capacitor 300D are the same as those of the thin-film capacitor 300A.

The lower electrode film 302D is disposed over the principal surface of a substrate (1) through an insulating film (3) and an adhesive film (5), such as described with respect to FIG. 2. The high dielectric film 303D is disposed on the lower electrode film 302D, and the upper electrode film 301D is disposed on the high dielectric film 303D. In this example, each of the lower electrode film 302D, the high dielectric film 303D and the upper electrode film 301D may be configured by four edge portions. That is, each of them may be rectangular. Also, an outside dimension of the high dielectric film 303D is larger than an outside dimension of the upper electrode film 301D, and an outside dimension of the lower electrode film 302D is larger than the outside dimension of the high dielectric film 303D.

As shown in FIG. 19, the upper electrode film 301D includes a plurality of first openings 308D-1, the high dielectric film 303D includes a plurality of second openings 308D-2 shown by alternative long and short dash lines, and the lower electrode film 302D includes a plurality of third openings 308D-3 shown by chain double-dashed lines. These openings 308D-1 through 308D-3 may be slit-shaped. The openings 308D-1 through 308D-3 are not vertically aligned with each other. The first openings 308D-1 are filled with an interlayer insulating film (110), such as described with respect to FIG. 2. The first openings 308D-1 are terminated away from all of the four edge portions of the upper electrode film 301D. That is, each of the four edge portions of the upper electrode film 301D is not divided by the first openings 308D-1. The first openings 308D-1 are arranged perpendicular to one of the edge portions of the upper electrode film 301D and arranged in parallel with each other. Each of the terminated ends of the first openings 308D-1 may have a curved end portion instead of a squared end portion. Also, the first openings 308D-1 are formed during patterning of the outline of the upper electrode film 301D. The second openings 308D-2 are filled with the upper electrode film 301D. The second openings 308D-2 are terminated away from all of the four edge portions of the high dielectric film 303D. That is, each of the four edge portions of the high dielectric film 303D is not divided by the second openings 308D-2. The second openings 308D-2 are arranged perpendicular to one of the edge portions of the high dielectric film 303D and arranged in parallel with each other. Each of the terminated ends of the second openings 308D-2 may have a curved end portion instead of a squared end portion. Also, the second openings 308D-2 are formed during patterning of the outline of the high dielectric film 303D. The third openings 308D-3 are filled with the high dielectric film 303D. The third openings 308D-3 are terminated away from all of the four edge portions of the lower electrode film 302D. That is, each of the four edge portions of the lower electrode film 302D is not divided by the third openings 308D-3. The third openings 308D-3 are arranged perpendicular to one of the edge portions of the lower electrode film 302D and arranged in parallel with each other. Each of the terminated ends of the third openings 308D-3 may have a curved end portion instead of a squared end portion. Also, the third openings 308D-3 are formed during patterning of the outline of the lower electrode film 302D. The upper electrode film 301D, the high dielectric film 303D and the lower electrode film 302D are covered by an interlayer insulating film (110), in the manner as described with respect to the thin-film capacitor 300A.

As described above, the thin-film capacitor 300D includes the first openings 308D-1 in the upper electrode film 301D, the second openings 308D-2 in the high dielectric film 303D and the third openings 308D-3 in the lower electrode film 302D. Moreover, the first openings 308D-1 are filled with the interlayer insulating film (110), the second openings 308D-2 are filled with the upper electrode film 301D, and the third openings 308D-3 are filled with the high dielectric film 303C. Therefore, each adhesiveness among the lower electrode film 302D, the high dielectric film 303D, the upper electrode film 301D and the interlayer insulating film (110) may be more improved.

Also, the first openings 308D-1 are terminated away from all of the four edge portions of the upper electrode film 301D. Therefore, the electrical current may flow smoothly in regions between the first openings 308D-1 of the upper electrode film 301D and in regions near the edge portions of the upper electrode film 301D. The third openings 308D-3 are terminated away from all of the four edge portions of the lower electrode film 302D. Therefore, the electrical current may flow smoothly in regions between the third openings 308D-3 of the lower electrode film 302D and in regions near the edge portions of the lower electrode film 302D. As a result, each resistivity of the upper electrode film 301D and the lower electrode film 302D may be suppressed from increasing, and then the high-frequency property of the thin-film capacitor 300D may be suppressed from deteriorating.

Figure 20:
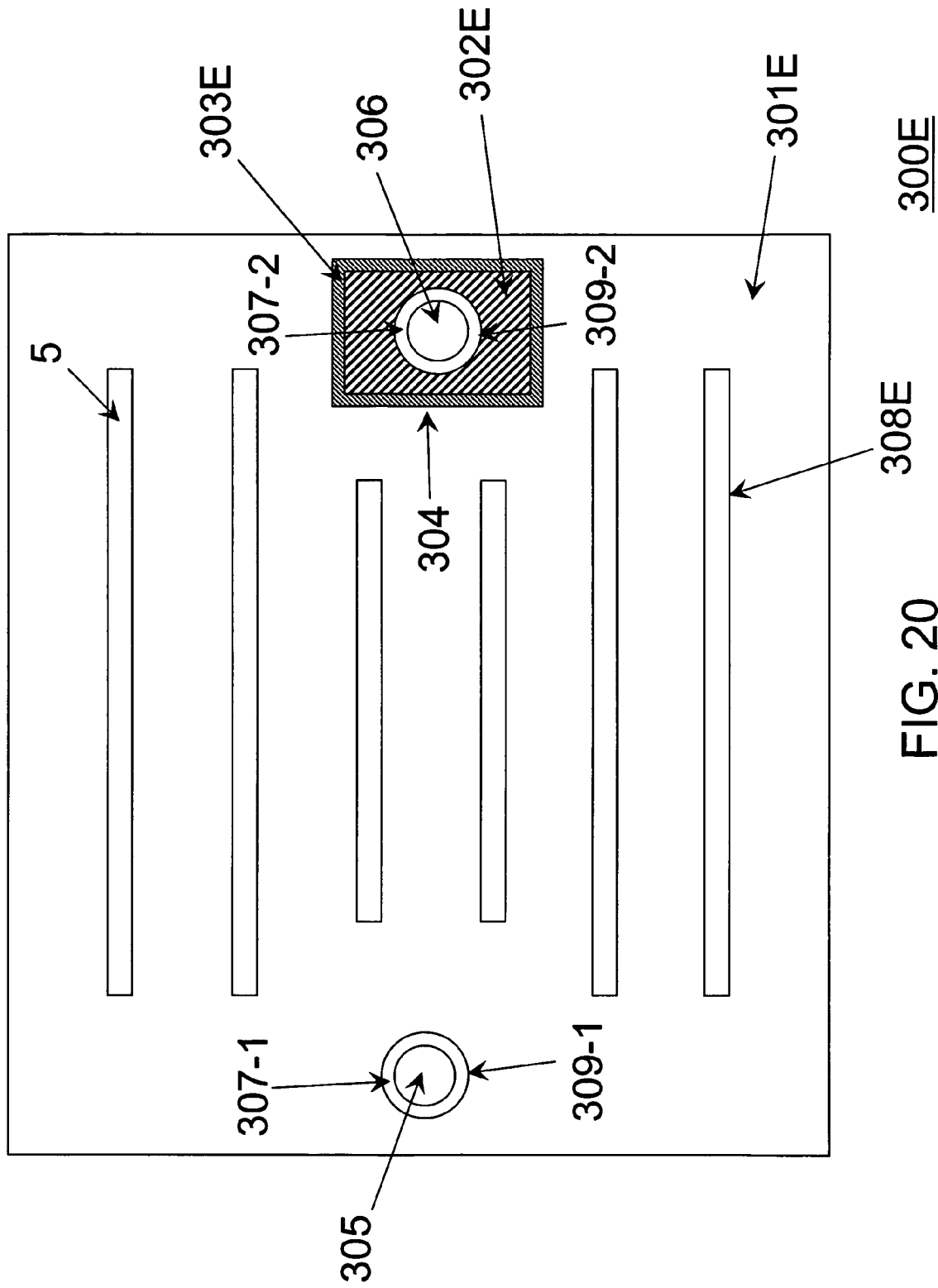

FIG. 20 is a schematic top view for describing another thin-film capacitor 300E according to the third preferred embodiment of the present invention. The thin-film capacitor 300E includes a lower electrode film 302E, a high dielectric film 303E and an upper electrode film 301E different than those of the thin-film capacitor 300A. The other features of the thin-film capacitor 300E are similar to those of the thin-film capacitor 300A.

The lower electrode film 302E is disposed over the principal surface of a substrate (1) through an insulating film (3) and an adhesive film (5), such as described with respect to FIG. 2. The high dielectric film 303E is disposed on the lower electrode film 302E, and the upper electrode film 301E is disposed on the high dielectric film 303E. In this example, each of the lower electrode film 302E, the high dielectric film 303E and the upper electrode film 301E may be configured by four edge portions. That is, each of them may be rectangular. Also, an outside dimension of the high dielectric film 303E is larger than an outside dimension of the upper electrode film 301E, and an outside dimension of the lower electrode film 302E is larger than the outside dimension of the high dielectric film 303E.

As shown in FIG. 20, a plurality of openings 308E penetrate through the upper electrode film 301E, the high dielectric film 303E and the lower electrode film 302E. The openings 308E may be slit-shaped and be arranged in parallel with each other. The adhesive film (5) is exposed from the openings 308E, and the openings 308E are filled with an interlayer insulating film (110), such as described with respect to FIG. 2. That is, the interlayer insulating film (110) contacts the adhesive film (5) through the openings 308E. The openings 308E are terminated away from all of the four edge portions of the upper electrode film 301E, the high dielectric film 303E and the lower electrode film 302E. That is, each of the four edge portions of the upper electrode film 301E, the high dielectric film 303E and the lower electrode film 302E is not divided by the openings 308E. The openings 308E are arranged perpendicular to one of the edge portions of the upper electrode film 301E, the high dielectric film 303E and the lower electrode film 302E. The upper electrode film 301E, the high dielectric film 303E and the lower electrode film 302E are covered by the interlayer insulating film, in the manner as described with respect to the thin-film capacitor 300A.

Since the thin-film capacitor 300E includes the openings 308E which penetrate through the upper electrode film 301E, the high dielectric film 303E and the lower electrode film 302E and which are filled with the interlayer insulating film (110), each adhesiveness among the lower electrode film 302E, the high dielectric film 303E, the upper electrode film 301E and the interlayer insulating film (110) may be more improved.

Also, the openings 308E are terminated away from all of the four edge portions of the upper electrode film 301E. Therefore, the electrical current may flow smoothly in regions between the openings 308E of the upper electrode film 301E and in regions near the edge portions of the upper electrode film 301E. Furthermore, the openings 308E are terminated away from all of the four edge portions of the lower electrode film 302E. Therefore, the electrical current may flow smoothly in regions between the openings 308E of the lower electrode film 302E and in regions near the edge portions of the lower electrode film 302E. As a result, each resistivity of the upper electrode film 301E and the lower electrode film 302E may be suppressed from increasing, and then the high-frequency property of the thin-film capacitor 300E may be suppressed from deteriorating.

According to the third preferred embodiment, the thin-film capacitor includes the openings in one film of the lower electrode film, the high dielectric film and the upper electrode film. Therefore, adhesiveness between the thin-film capacitor and the interlayer insulating film or adhesiveness between the lower electrode film, the high dielectric film and the upper electrode film may be more improved. Also, the openings are terminated away from the edge portions which configure an outline of one film of the lower electrode film, the high dielectric film and the upper electrode film. Therefore, the electrical current may flow smoothly in regions between the openings of the one film and in regions near the edge portions of the one film. As a result, the resistivities of the upper electrode film and the lower electrode film may be suppressed from increasing, and then the high-frequency property of the thin-film capacitor may be suppressed from deteriorating. Furthermore, since the first openings are formed during patterning of the outline of the one film of the lower electrode film, the high dielectric film and the upper electrode film, the thin-film capacitor is manufactured without involved processes.

Figure 21:
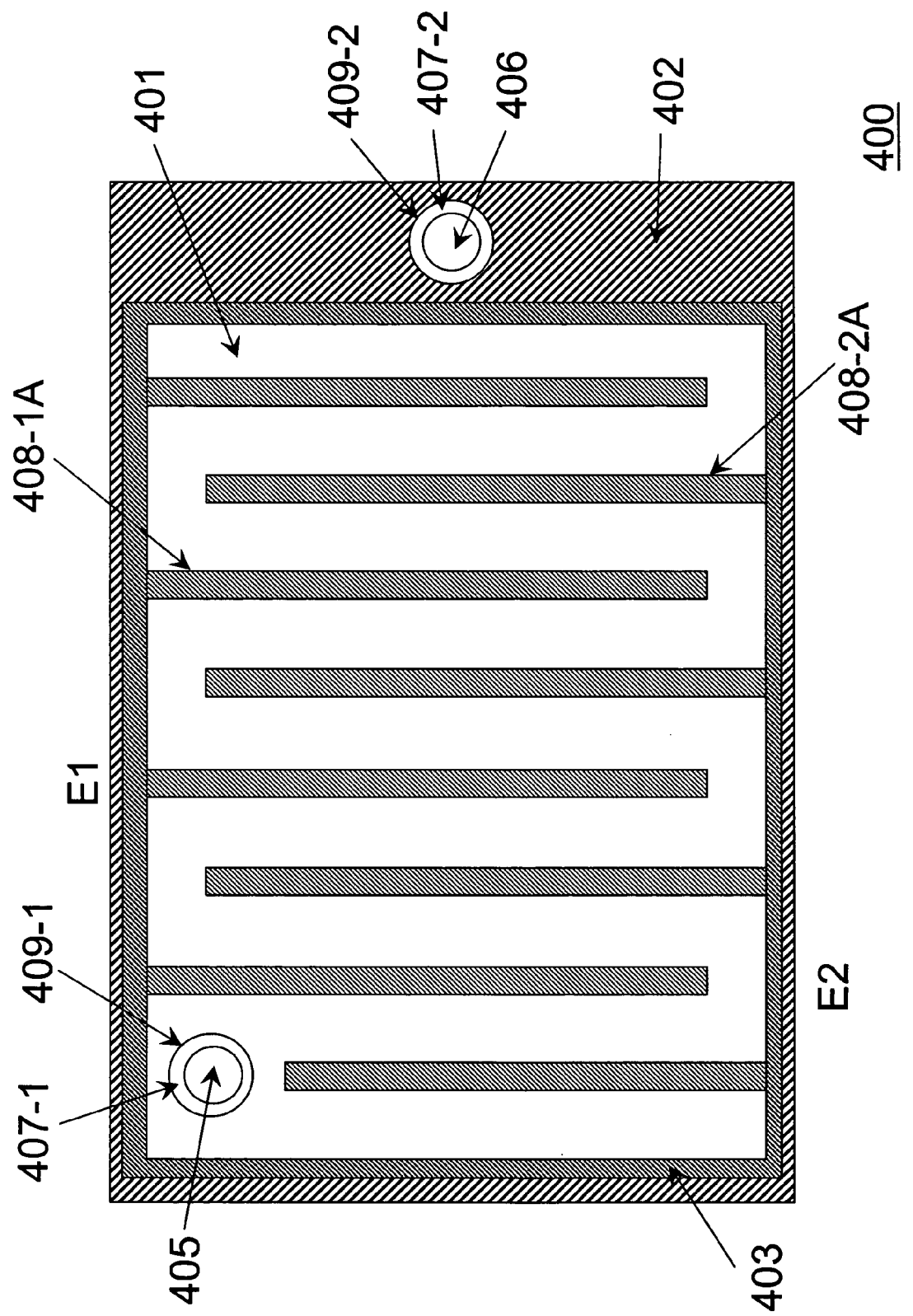
FIG. 21 is a schematic top view for describing a thin-film capacitor according to a fourth preferred embodiment of the present invention.

FIG. 21 is a schematic top view for describing a thin-film capacitor 400 according to a fourth preferred embodiment of the present invention. The thin-film capacitor 400 includes an upper electrode film 401 different than that of the thin-film capacitor 100A according to the first preferred embodiment. The other features of the thin-film capacitor 400 are similar to those of the thin-film capacitor 100A.

The thin-film capacitor 400 includes a lower electrode film 402, a high dielectric film 403 and the upper electrode film 401. The lower electrode film 402 is disposed over a principal surface of a substrate (1) through an insulating film (3) and an adhesive film (5), such as described with respect to FIG. 2. The high dielectric film 403 is disposed on the lower electrode film 402, and the upper electrode film 401 is disposed on the high dielectric film 403. An interlayer insulating film such as described with respect to FIG. 2, is disposed over the principal surface of the substrate (1) in order to cover the lower electrode film 402, the high dielectric film 403 and the upper electrode film 401. The interlayer insulating film (110) includes a first contact hole 409-1 and a second contact hole 409-2 therein. The first contact hole 409-1 is filled with a first barrier film 407-1 and a first interconnection film 405. The first interconnection film 405 is electrically coupled to the upper electrode film 401 through the first barrier film 407-1. The second contact hole 409-2 is filled with a second barrier film 407-2 and a second interconnection film 406. The second interconnection film 406 is electrically coupled to the lower electrode film 402 through the second barrier film 407-2. The upper electrode film 401 includes a plurality of first openings 408-1A and a plurality of second openings 408-2A, such as described with respect to the upper electrode film 101A according to the first preferred embodiment. The thin-film capacitor 400 is covered by the interlayer insulating film (110) so that the first and second openings 408-1A and 408-2A are filled with the interlayer insulating film (110). Furthermore, in the thin-film capacitor 400 of the present invention, the first contact hole 409-1 is arranged inside a region occupied by the upper electrode film 401, and the second contact hole 409-2 is arranged outside the region occupied by the upper electrode film 401. Also, the second contact hole 409-2 is arranged outside the region occupied by the high dielectric film 403.

According to the fourth preferred embodiment, the same effects may be realized as well as according to the first preferred embodiment. Furthermore, according to the fourth preferred embodiment, the second contact hole which is coupled to the lower electrode film is arranged outside the region occupied by the upper electrode film. Therefore, the flexibility of the design of the second contact hole may be improved. That is, the thin-film capacitor may be manufactured without involved processes.

Also, in the above mentioned third preferred embodiment, an area of the contact opening may be different than an area of each of the openings. On such an occasion as this, the area of each of the openings may be designed without relation to the area of the contact opening. That is, the openings may be formed to have narrow or broad width. Therefore, the number of the openings may be controlled. As a result, the area of each of the openings or the number of the openings may be set in order to improve the adhesiveness between the thin-film capacitor and the interlayer insulating film, the adhesiveness between the lower electrode film, the high dielectric film and the upper electrode film, and in order to suppress the high-frequency property of the thin-film capacitor from deteriorating. Furthermore, the area of the contact opening may be flexibly set without relation to the area of the openings, so that the second interconnection film is not electrically coupled to the upper electrode film. On the other hand, the area of the contact opening may be substantially equal to the area of each of the openings. On such an occasion as this, any one of the openings may be used as the contact opening, in order to realize the electrical connection between the second interconnection film and the lower electrode film. Therefore, the location of the electrical connection between the second interconnection film and the lower electrode film may be flexibly designed.

Furthermore, in each of the above mentioned three preferred embodiments, each of the openings may have an even width totally, but may have an uneven width partially. Also, the openings may have round or meandering shapes.

What is claimed is:

1. A thin-film capacitor, comprising:
   a substrate including a principal surface;
   a lower electrode film disposed over the principal surface of the substrate;
   a high dielectric film disposed on the lower electrode film; and
   an upper electrode film disposed on the high dielectric film,
   wherein one film of the lower electrode film, the high dielectric film and the upper electrode film includes a first edge portion and a second edge portion which is placed opposite to the first edge portion, and further includes a plurality of first openings which extend from the first edge portion toward the second edge portion and a plurality of second openings which extend from the second edge portion toward the first edge portion, and
   wherein the first openings are terminated away from the second edge portion and the second openings are terminated away from the first edge portion, and wherein one of the second openings is shorter than all other of the second openings.

2. The thin-film capacitor according to claim 1, wherein each of the first and second openings is slit-shaped.

3. The thin-film capacitor according to claim 1, wherein the first openings are arranged in parallel with the second openings.

4. The thin-film capacitor according to claim 1, wherein the first openings extend perpendicular to the first edge portion and the second openings extend perpendicular to the second edge portion.

5. The thin-film capacitor according to claim 1, wherein the one film which includes the first and second openings is windingly configured.

6. The thin-film capacitor according to claim 1, further comprising:
   an interlayer insulating film that covers the lower electrode film, the high dielectric film and the upper electrode film, wherein the interlayer insulating film includes first and second contact holes which have respectively different configurations than the first and second openings;
   a first interconnection film disposed on the interlayer insulating film to be electrically coupled to the upper electrode film through the first contact hole; and
   a second interconnection film disposed on the interlayer insulating film to be electrically coupled to the lower electrode film through the second contact hole, wherein the first interconnection film in the first contact hole is positioned between the first edge portion and an end of the one of the second openings.

7. The thin-film capacitor according to claim 6, wherein the first and second contact holes are arranged inside a region occupied by the upper electrode film, the first contact hole being arranged near the first edge portion and the second contact hole being arranged in between the first and second edge portions.

8. The thin-film capacitor according to claim 6, wherein the first contact hole is arranged inside a region occupied by the upper electrode film and the second contact hole is arranged outside the region occupied by the upper electrode film.

9. The thin-film capacitor according to claim 1, wherein another film of the lower electrode film, the high dielectric film and the upper electrode film includes a plurality of third openings therein, the another film being different than the one film, and wherein the third openings are arranged away from the first and second openings.

10. A thin-film capacitor, comprising:
a substrate including a principal surface;
a lower electrode film disposed over the principal surface of the substrate;
a high dielectric film disposed on the lower electrode film; and
an upper electrode film disposed on the high dielectric film,
wherein one film of the lower electrode film, the high dielectric film and the upper electrode film includes a plurality of edge portions which configure an outline of the one film, and
wherein the one film further includes a plurality of openings which respectively extend therein and which are terminated away from all of the edge portions, and wherein one of the openings is shorter than other of the openings.

11. The thin-film capacitor according to claim 10, wherein each of the openings is arranged perpendicular to one of the edge portions.

12. The thin-film capacitor according to claim 10, wherein each of the openings is slit-shaped.

13. The thin-film capacitor according to claim 10, wherein each of the openings is arranged in parallel with each other.

14. The thin-film capacitor according to claim 10, further comprising:
an interlayer insulating film that covers the lower electrode film, the high dielectric film and the upper electrode film, wherein the interlayer insulating film includes first and second contact holes which have respectively different configurations than the openings;
a first interconnection film disposed on the interlayer insulating film to be electrically coupled to the upper electrode film through the first contact hole; and
a second interconnection film disposed on the interlayer insulating film to be electrically coupled to the lower electrode film through the second contact hole,
wherein the first interconnection film in the first contact hole is positioned between one of the edge portions and an end of the one of the openings.

15. The thin-film capacitor according to claim 14, wherein the first and second holes are arranged inside a region occupied by the upper electrode film, the first and second contact holes being arranged near the edge portions.

16. The thin-film capacitor according to claim 10, wherein another film of the lower electrode film, the high dielectric film and the upper electrode film includes a plurality of other openings therein, the another film being different than the one film, and wherein the other openings are arranged away from the openings.

17. A thin-film capacitor comprising:
a substrate including a principal surface;
a lower electrode film disposed over the principal surface of the substrate;
a high dielectric film disposed on the lower electrode film; and
an upper electrode film disposed on the high dielectric film,
wherein one film of the lower electrode film, the high dielectric film and the upper electrode film includes a plurality of edge portions which configure an outline of the one film, and
wherein the one film further includes a plurality of openings which respectively extend therein and which are terminated away from all of the edges portions,
wherein each of the openings is arranged diagonally to one of the edge portions.

18. The thin-film capacitor according to claim 17, wherein each of the openings is slit-shaped.

19. The thin-film capacitor according to claim 17, wherein each of the openings is arranged in parallel with each other.

20. The thin-film capacitor according to claim 17, further comprising:
an interlayer insulating film that covers the lower electrode film, the high dielectric film and the upper electrode film, wherein the interlayer insulating film includes first and second holes which have respectively different configurations than the openings;
a first interconnection film disposed on the interlayer insulating film to be electrically coupled to the upper electrode film though the first contact hole; and
a second interconnection film disposed on the interlayer insulating film to be electrically coupled to the lower electrode film through the second contact hole.

21. The thin-film capacitor according to claim 20, wherein the first and second holes are arranged inside a region occupied by the upper electrode film, the first and second contact holes being arranged near the edge portions.

22. The thin-film capacitor according to claim 17, wherein another film of the lower electrode film, the high dielectric film and the upper electrode film includes a plurality of other openings therein, the another film being different than the one film, and wherein the other openings are arranged away from the openings.

* * * * *